US006148158A

United States Patent [19]

Amemiya

[11] Patent Number: 6,148,158

[45] **Date of Patent: *Nov. 14, 2000**

[54] IMAGE PROCESSING APPARATUS AND METHOD HAVING A PLURALITY OF IMAGE FORMING UNITS FOR PERFORMING IMAGE FORMATION USING PREDETERMINED COLORS

[75] Inventor: Koji Amemiya, Tokyo, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/684,090

[22] Filed: Jul. 19, 1996

[30] Foreign Application Priority Data

Jul. 20, 1995 [JP] Japan .................................... 7-184198

[51] Int. Cl.[7] .............................. G03G 15/01; G03F 3/08

[52] U.S. Cl. ............................ 399/39; 358/519; 358/521

[58] Field of Search .................................... 358/518, 519, 358/521, 523; 399/39

[56] References Cited

U.S. PATENT DOCUMENTS

| | | | |
|---|---|---|---|
| 4,888,636 | 12/1989 | Abe | 358/519 |
| 5,258,783 | 11/1993 | Sasanuma et al. | 346/157 |
| 5,371,609 | 12/1994 | Suzuki et al. | 358/518 X |
| 5,414,531 | 5/1995 | Amemiya et al. | 358/465 |
| 5,557,412 | 9/1996 | Saito et al. | 358/296 |
| 5,566,372 | 10/1996 | Ikeda et al. | 355/208 |
| 5,579,090 | 11/1996 | Sasanuma et al. | 358/521 X |
| 5,583,644 | 12/1996 | Sasanuma et al. | 358/296 |
| 5,585,927 | 12/1996 | Fukui et al. | 358/519 X |
| 5,697,012 | 12/1997 | Sasanuma et al. | 358/518 X |

FOREIGN PATENT DOCUMENTS

| | | | |
|---|---|---|---|
| 63095471 | 4/1988 | Japan | G03G 15/01 |
| 05333652 | 12/1993 | Japan | G03G 15/00 |
| 06043729 | 2/1994 | Japan | G03G 15/01 |
| 07056424 | 3/1995 | Japan | G03G 15/06 |

*Primary Examiner*—Fred L. Braun
*Attorney, Agent, or Firm*—Fitzpatrick, Cella, Harper & Scinto

[57] ABSTRACT

An image processing apparatus includes a plurality of image forming units for performing image formation using predetermined colors. A pattern image is formed by outputting specific pattern data to each image forming unit, density of the pattern image is measured and the gradation correction characteristics are controlled in accordance with the measure density. By performing processing in units of colors corresponding to the image forming units, color image formation having good color balance and gradation characteristics is attained over a long period of time. By controlling gradation correction characteristics in consideration of the density obtained by actually outputting the pattern image onto a recording medium, and reading the pattern image, color image formation having good density reproducibility is realized.

16 Claims, 24 Drawing Sheets

(SPECIAL CHARACTERISTICS OF YELLOW TONER)

(SPECIAL CHARACTERISTICS OF CYAN TONER)

IMAGE PROCESSING APPARATUS AND METHOD HAVING A PLURALITY OF IMAGE FORMING UNITS FOR PERFORMING IMAGE FORMATION USING PREDETERMINED COLORS

BACKGROUND OF THE INVENTION

This invention relates to an image processing apparatus and method and, more particularly, to an image processing apparatus and method for performing image formation using a plurality of image forming units.

In a conventional image forming apparatus capable of forming a full-color image, a plurality of color toner images are formed on an image carrier in an image forming unit, and are sequentially transferred onto a recording medium to overlap each other, thereby forming a full-color image. Therefore, in order to stabilize the image quality of an output image, the toner images to be transferred to overlap each other must always maintain a stable density balance.

As a method of stabilizing the density balance of an output image, the following methods are known.

For example, upon completion of the warm-up operation immediately after the image forming apparatus is started, specific patterns in units of colors are formed on an image carrier such as a photosensitive body or photoconductor, and light emitted by a predetermined LED and reflected by each of the specific patterns in units of colors is measured by a sensor such as a photodiode, thus detecting the toner densities of the respective colors. When it is determined based on the measurement result that the balance of the toner densities is not stable, the measurement result is fed back as an image forming condition, e.g., γ correction, thereby improving stability of the final output image quality.

Furthermore, in another method, even when the image forming characteristics change due to various environmental variation factors, a specific pattern is formed on the image carrier in correspondence with the environmental variation amount, and the density of the specific pattern is read in the same manner as the above-mentioned method. The measurement result is fed back as an image forming condition, e.g., γ correction, thus improving stability of the final output image quality as well.

However, conventionally, an image forming apparatus having a plurality of image carriers for respectively forming a plurality of color toner images does not give sufficient consideration to precise detection of the states of the image carriers and feeding back of the detection results for correction control of image data.

Also, controlling the image forming condition of such image forming apparatus by effectively using an image reading means for supplying image data is also not given sufficient consideration.

On the other hand, if the method of reading the density of a specific pattern on an image carrier is applied to an image forming apparatus having a plurality of image carriers for respectively forming a plurality of color toner images, the characteristics of means (to be referred to as toner image reading means hereinafter) for reading light reflected by toner images of specific patterns on the respective image carriers must be substantially absolutely equivalent to each other with respect to the respective colors.

Note that the "absolutely equivalent" state is a state wherein the toner image reading means for respectively reading light reflected by, e.g., yellow, magenta, and cyan toner images used in image formation detect equal density values when they read a gray scale in an achromatic color formed by evenly superposing the three colors.

When the toner image reading means are not absolutely equivalent to each other with respect to the respective colors, an image having a poor color balance is output.

It is possible to some extent to adjust the toner image reading means to be absolutely equivalent to each other for the respective colors upon assembling of the image forming apparatus. However, when the toner image reading means for a certain color is exchanged due to, e.g., a failure, it is very difficult to adjust the characteristics of the exchanged toner image reading means to be absolutely equivalent to those of the other toner image reading means.

As for the respective image forming units, the density obtained by reading a specific pattern on each image carrier (photosensitive drum) does not always match the density of an image actually output onto a recording medium (paper) after the image forming units have been used over a long period of time.

For example, when a cleaning blade has been in sliding contact with the image carrier over a long period of time so as to clean the residual toner on the image carrier upon transfer, the surface of the image carrier becomes rough and the relationship between the adhesion amount of toner and the reflected light amount changes from that in an initial state. Such change also takes place when the optical characteristics of the toner image reading means change due to, e.g., adhesion of toner, dust, and the like to an optical window for protecting an optical element.

Therefore, an image forming apparatus having a plurality of image forming units must have a means for strictly correcting the characteristics of the toner image reading means themselves, and their relationship. When the image forming apparatus does not have any correction means, an output image with an optimal color balance cannot be obtained when the toner image reading means is exchanged or when the apparatus is used over a long period of time.

The above-mentioned problems will be described in detail below while taking as an example a full-color image forming apparatus having one image forming unit.

As the image forming apparatus having one image forming unit, an image forming apparatus which has one image carrier and a transfer drum, and sequentially transfers and outputs respective color toner images formed in turn on the image carrier onto a recording medium carried on the transfer drum will be examined. Such image forming apparatus has only one toner image reading means, and hence, the respective colors are read by a single sensor within a predetermined photosensitivity range. For this reason, it is checked whether a certain relative density ratio is obtained among the densities of the colors even when, for example, the sensitivity of this sensor deviates from average sensitivity.

A case will be examined below wherein the following density correction control operations are performed based on the toner densities of colors read by a single toner image reading means.

(1) The maximum densities are determined in units of colors of toner images formed on the image carrier.

(2) The linearity of the toner image density with respect to the laser emission time (or emission amount) of a toner image formed on the image carrier is maintained in units of colors.

(3) The toner adhension amounts (fogging amounts) are controlled in units of colors of toner images formed on the image carrier.

Of the above-mentioned three control operations, since the ratio of the density to the emission time in (2) can be attained even by a single toner image reading means, for example, an achromatic gray scale can be easily formed.

However, as for determination of the maximum toner density values in (1) and fogging amount control in (3), since the respective colors cannot be evaluated based on their absolute amounts, the maximum density in each color toner image cannot be determined, and the fogging amount cannot be appropriately corrected.

On the other hand, in the image forming apparatus having a plurality of image forming units corresponding to colors, the constituting elements such as photodiodes that constitute toner image reading means in the respective image forming units have a difference although the difference falls within a tolerance. For this reason, the image forming units of the respective colors have different maximum toner density values in (1), and hence, it is difficult to form an achromatic gray scale. Also, the fogging amount control in (3) is not sufficient, and for example, chromatic fog may be generated upon formation of a gray scale image.

SUMMARY OF THE INVENTION

Accordingly, it is an object of the present invention to provide an image processing apparatus and method, which can maintain image formation with a good color balance and gradation characteristics over an extended period of time, i.e., to accurately detect the states of color image forming units, and to control gradation correction on the basis of the detected states.

According to the present invention, the foregoing object is attained by providing an image processing apparatus comprising pattern forming means for forming pattern images by outputting specific pattern data to the image forming units; first density measuring means, arranged in correspondence with the image forming units, for measuring densities of the pattern images formed by the image forming units to obtain first density data; gradation correcting means for performing gradation correction of image data to be output to the image forming units; and control means for controlling correction characteristics of said gradation correction means in accordance with the first density data.

And, it is another object of the present invention to provide an image processing apparatus and method, which controls the gradation characteristics on the basis of a pattern density obtained by outputting pattern images formed on image forming units onto a medium to overlap each other.

According to the present invention, the foregoing object is attained by providing an image processing apparatus further comprising second density measuring means for obtaining second density data for a plurality of colors on the basis of image signals obtained by reading, by said image input means, a recording medium on which a plurality of color pattern images are formed, and wherein said control means controls the correction characteristics of said gradation correction means in accordance with the first and second density data.

And, it is a further object of the present invention to provide an image processing apparatus and method, which can control the gradation correction characteristics on the basis of a pattern image density obtained by actually outputting the densities of pattern images formed on image forming units onto a medium to overlap each other by effectively using an image reading means.

The foregoing object is attained by providing an image processing apparatus having a plurality of image forming units for performing image formation using predetermined colors, comprising reading means for reading an original image, and generating color image data; color component output means for outputting a plurality of color component data corresponding to each of the image forming units on the basis of the color image data; correction means for correcting gradation characteristics of the plurality of color component data; output means for outputting a medium on which a color image is formed by the plurality of image forming units; supply means for supplying a reference pattern signal to the plurality of image forming units; and control means for controlling gradation correction characteristics of said correction means on the basis of color image data generated by said reading means which reads a medium on which a reference color signal is formed by the image forming units on the basis of the reference pattern signal.

It is further object of the present invention to improve the accuracy of a detection means arranged in each image forming unit.

According to the present invention, the foregoing object is attained by providing an image processing apparatus having a plurality of image forming units for performing image formation using predetermined colors, wherein each of the image forming units comprises an image carrier for carrying an image, and conversion means for reading the image on said image carrier and converting the read image into an electrical signal, and said apparatus further comprises correction means for correcting a variation of said conversion means of the image forming units.

The invention is particularly advantageous since an image with good gradation characteristics and color balance can be formed over a long period of time upon formation of a full-color image.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Preferred embodiments of the present invention will now be described in detail in accordance with the accompanying drawings.

<First Embodiment>

Figure 1:
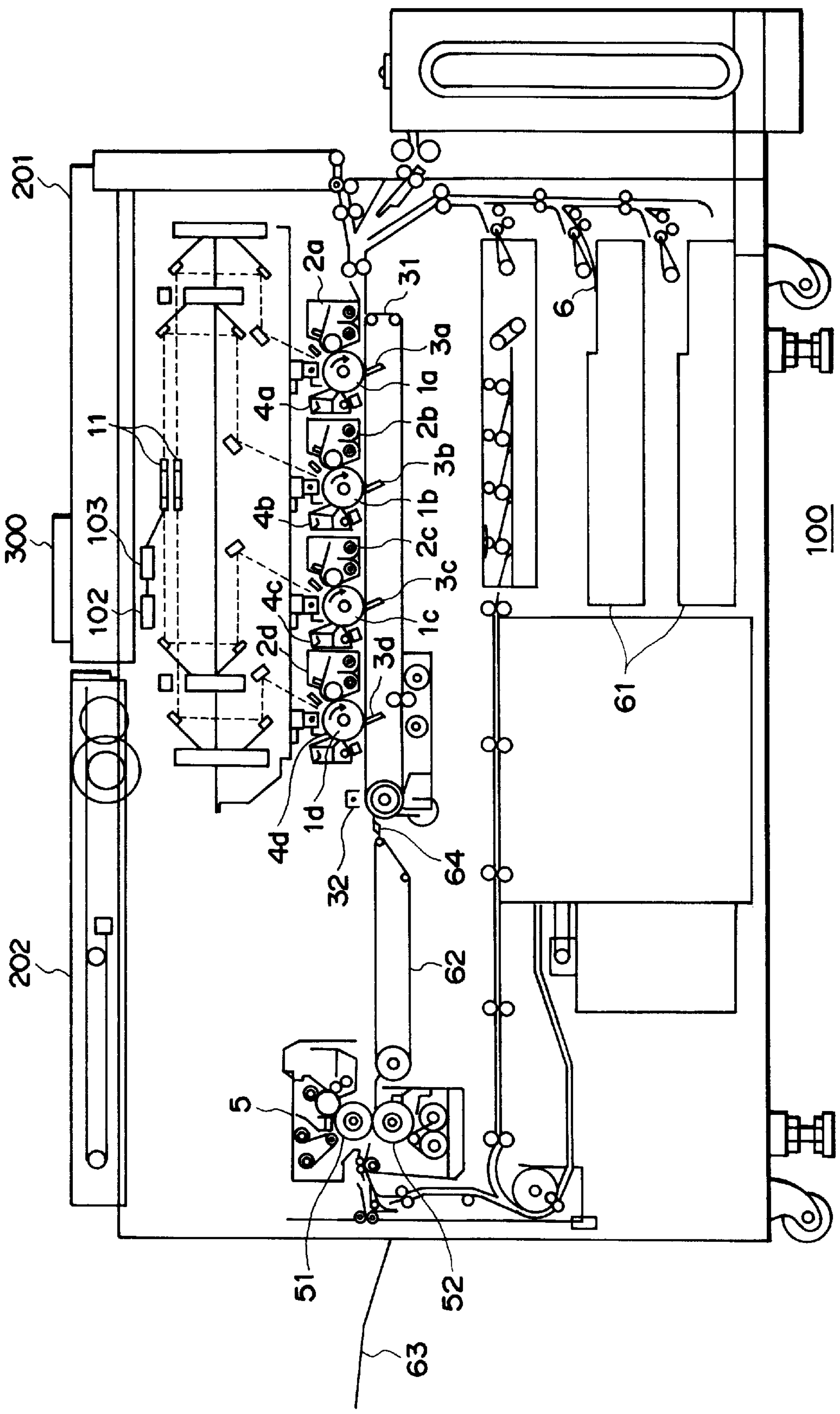
FIG. 1 is a sectional view of an image forming apparatus of the first embodiment according to the present invention.

FIG. 1 is a sectional view of a printer 100 as an image forming apparatus of this embodiment, which has a plurality of image forming units.

Referring to FIG. 1, the printer 100 comprises a laser beam printer (LBP), and forms an image on a recording medium on the basis of an image signal of an original read by an original reading unit 202. Reference numeral 300 denotes an operation panel on which various switches for operations, LED indicators, and the like are arranged; and 201, a printer control unit for controlling the entire printer 100, and interpreting character information and the like supplied from a host computer (not shown) or the like. The printer control unit 201 performs gradation correction processing of this embodiment, and converts an image signal into a driving signal of a semiconductor laser 103 and outputs it to a laser driver 102. The laser driver 102 is a circuit for driving the semiconductor laser 103. The laser driver 102 switches the ON/OFF state of the semiconductor laser 103 in correspondence with an input original image signal, and controls the laser ON time. Four sets of laser drivers 102 and semiconductor lasers 103 are arranged in correspondence with Y, M, C, and K colors.

Reference numerals 1_a_, 1_b_, 1_c_, and 1_d_ denote photosensitive drums for forming yellow (Y), magenta (M), cyan (C), and black (K) toner images; 2_a_, 2_b_, 2_c_, and 2_d_, developers for developing the corresponding toner images; 3_a_, 3_b_, 3_c_, and 3_d_, toner image density measuring units for measuring the toner densities on the corresponding photosensitive drums in this embodiment; and 4_a_, 4_b_, 4_c_, and 4_d_, cleaning blades for removing residual toner which is not transferred onto a recording medium. In this embodiment, a group of, for example, the components 1_a_, 2_a_, 3_a_, and 4_a_ is called one image forming unit. More specifically, the printer 100 comprises four image forming units.

Laser beams emitted by the semiconductor lasers 103 are deflected in the right-and-left directions by rotary polygonal mirrors 11, and scan the surfaces of the photosensitive drums 1_a_ to 1_d_ via a plurality of mirrors, thus forming electrostatic latent images in units of colors. The photosensitive drums 1_a_ to 1_d_ on which the latent images are formed rotate in the direction of the arrow, and the latent images are visualized as toner images by the corresponding developers 2_a_ to 2_d_.

On the other hand, a recording medium 6 such as a recording sheet stored in one of recording sheet cassettes 61 is placed on a transfer belt 31, and the toner images formed on the photosensitive drums 1_a_ to 1_d_ in the order of Y, M, C, and K are transferred onto the recording medium 6. Then, the recording medium 6 is conveyed by a conveyor belt 62. When a double-sided copy operation is to be performed, the recording medium is reversed by the conveyor belt 62 by moving a separation plate 64 downward in FIG. 1, and the reversed recording medium is again conveyed onto the transfer belt 31.

Upon completion of the transfer operation, the recording medium 6 is separated from the transfer belt 31, and the toner images are fixed by a pair of fixing rollers 51 and 52 in a fixing unit 5. Thereafter, the recording medium 6 is exhausted onto a sheet exhaust unit 63. As described above, a full-color image is formed on the recording medium 6 in the printer 100.

Figure 2:
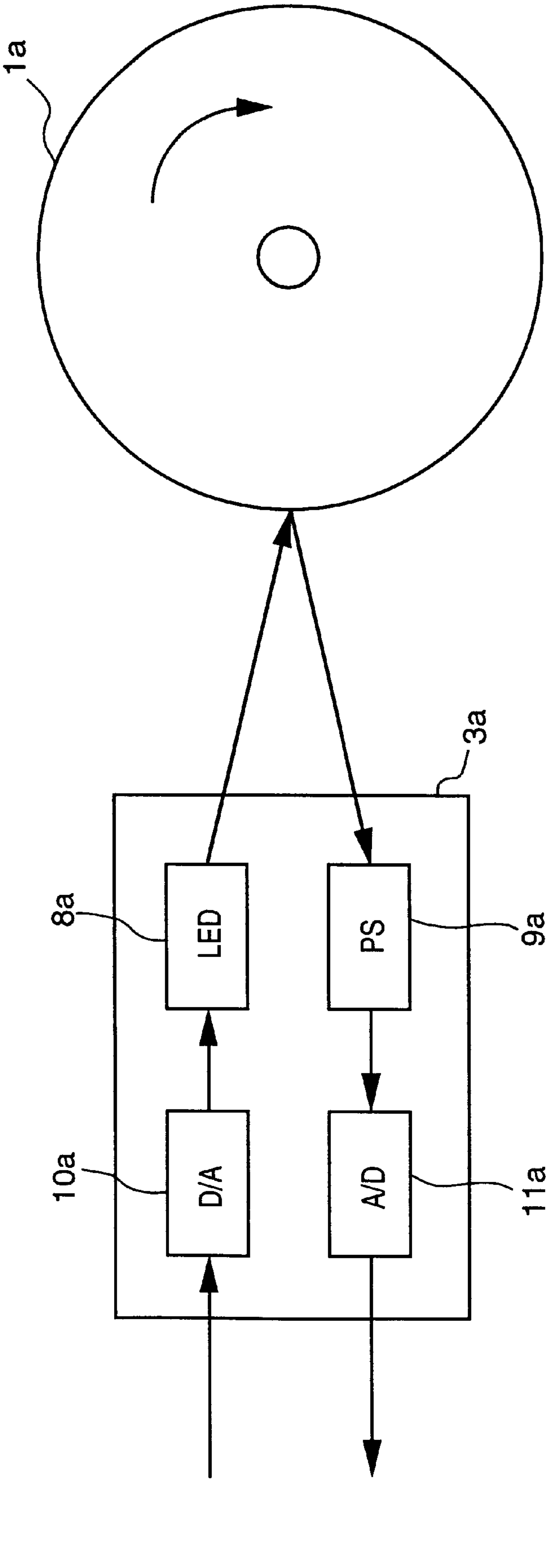
FIG. 2 is a block diagram showing the detailed arrangement of a toner image density measuring unit in the first embodiment.

The detailed arrangement of the above-mentioned toner image density measuring units 3_a_ to 3_d_ will be described below with reference to FIG. 2. FIG. 2 is a block diagram for explaining in detail the toner image density measuring unit 3_a_ in the yellow image forming unit shown in FIG. 1 above. Referring to FIG. 2, the toner density measuring unit 3_a_ comprises an LED 8_a_, a photosensor 9_a_, a D/A converter 10_a_, and an A/D converter 11_a_.

In the toner image density measuring unit 3_a_, a predetermined digital signal value is input to the D/A converter 10_a_ and is converted into an analog signal value. Based on the converted analog signal value, the LED 8_a_ illuminates a toner image formed on the photosensitive drum 1_a_. Light reflected by the yellow toner image is detected by the photosensor 9_a_ as an analog signal indicating the luminance level. The detected analog signal is converted by the A/D converter 11_a_ into a digital signal. As will be described in detail later, the yellow toner density is measured on the basis of the signal detected by the photosensor 9_a_.

The remaining toner image density measuring units 3_b_ to 3_d_ shown in FIG. 1 have the same arrangement as that of the toner image density measuring unit 3_a_ shown in FIG. 2. Note that the outputs of the LEDs 8_a_ to 8_d_ and the peak values of optical wavelengths to be detected by the photosensors 9_a_ to 9_d_ are respectively set to be optimal values in advance in correspondence with the individual toner colors in the toner image density measuring units 3_a_ to 3_d_.

Figure 3:
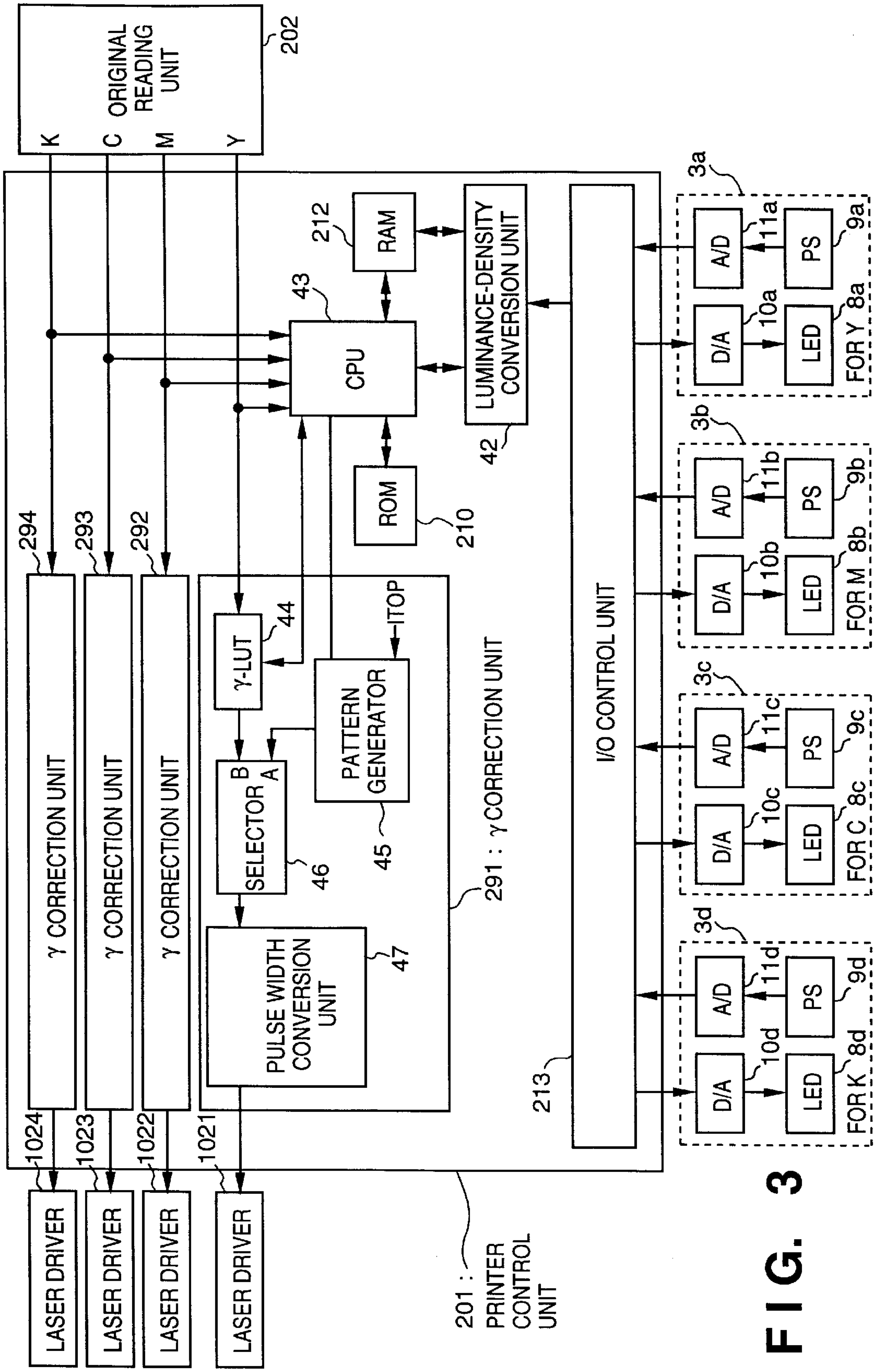
FIG. 3 is a block diagram showing the detailed arrangement of a printer control unit in the first embodiment.

The printer control unit 201 which performs gradation control using the toner image density measuring units 3_a_ to 3_d_ will be described below. FIG. 3 is a block diagram showing the arrangement of the printer control unit 201.

Referring to FIG. 3, reference numeral 43 denotes a CPU which comprises a microprocessor, and the like, and executes a control program (to be described later). Reference numeral 210 denotes a ROM for storing a control program of the CPU 43 and various data; 212, a RAM used as a work area of the CPU 43; 42, a luminance-density conversion unit for performing luminance-density conversion (to be described later); 213, an I/O control unit for exchanging data between the above-mentioned toner image density measuring units 3_a_ to 3_d_ and the CPU 43; and 291 to 294, γ correction units for respectively performing γ correction processing for Y, M, C, and K.

Each of the γ correction units 291 to 294 comprises a γ-LUT 44 for correcting the density characteristics of input image data, a pattern generator 45 for generating a pattern signal representing a patch pattern, a selector 46 for selecting one of the outputs from the γ-LUT 44 and the pattern generator 45 in accordance with an instruction from the CPU 43, and a pulse width modulation unit 47 for performing pulse width modulation of the output from the selector 46 on the basis of comparison with a triangular wave having a predetermined period.

The γ-LUT 44 comprises a RAM, and its correction characteristics are set by the CPU 43. The pattern generator 45 generates a pattern signal so as to form a patch pattern (to be described later) in synchronism with an ITOP signal that indicates the write start timing of the leading end of an image. The selector 46 selects the A side (the pattern signal from the pattern generator 45) when the CPU 43 sets a mode for performing gradation characteristic stabilization control (to be described later), or selects the B side (the correction signal from the γ-LUT 44) when the CPU 43 sets a normal mode for actually reproducing an original image.

Reference numerals 1021 to 1024 denote laser drivers for driving lasers so as to form Y, M, C, and K images, respectively.

In the printer control unit 201 shown in FIG. 3, image signals of an original image read by the CCD sensor of the original reading unit 202 are subjected to gradation correction in the γ correction units 291 to 294, as will be described later, and the corrected image signals are used for forming images on a recording sheet. Thereafter, the recording sheet on which a full-color image is formed is output from the printer unit 100.

On the other hand, for example, a luminance signal of light reflected by a yellow toner image detected by the photosensor 9_a_ in the toner image density measuring unit 3_a_ is input to the luminance-density conversion unit 42 via the I/O control unit 213 in the printer control unit 201, and is converted into a density signal. The density signal is then supplied to the CPU 43. The CPU 43 sets a density correction parameter (to be described later) for yellow on the basis of the signal supplied from the photosensor 9_a_.

Figure 4:
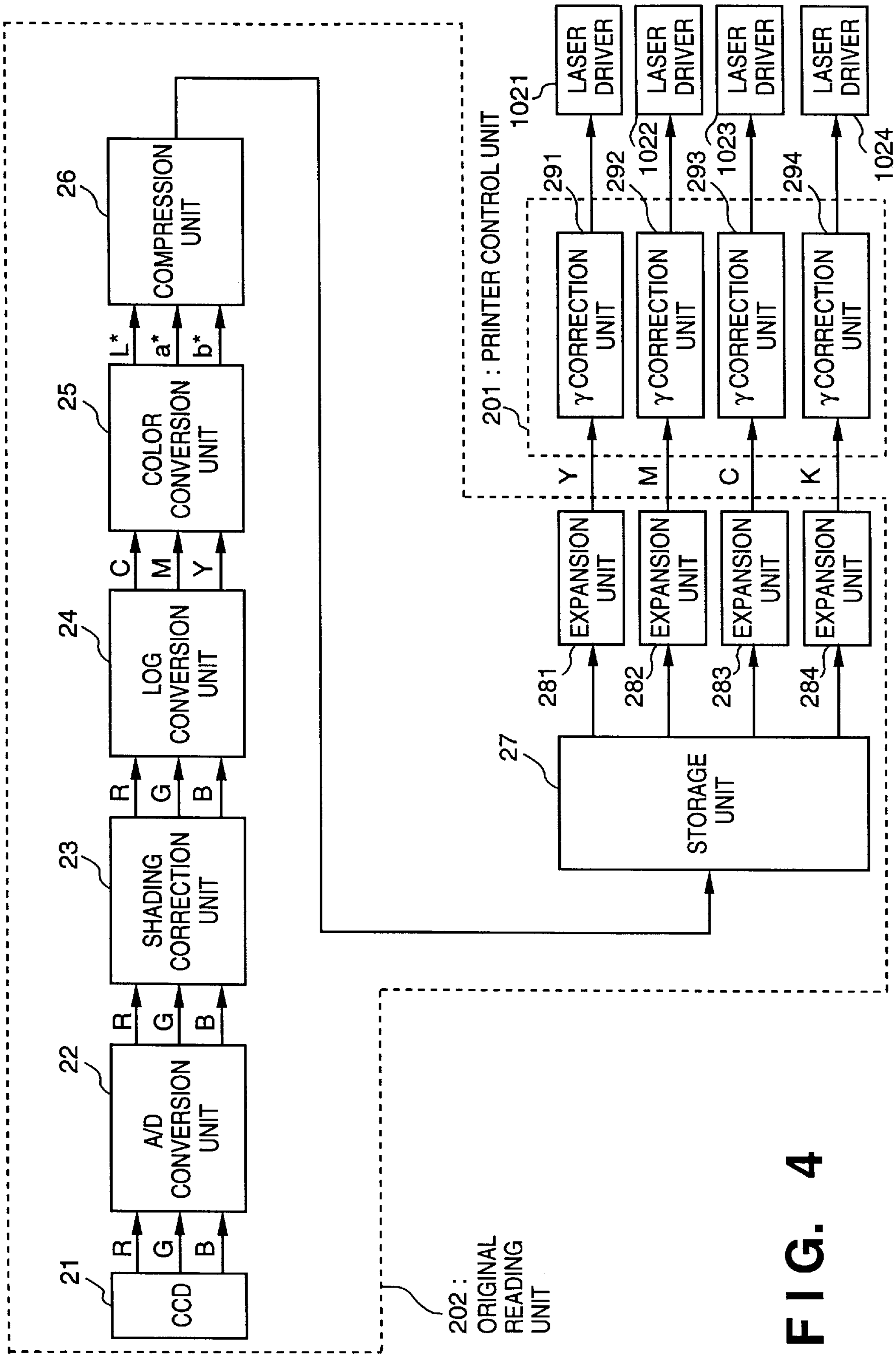
FIG. 4 is a block diagram showing the detailed arrangement of an image reading unit 202 in the first embodiment.

FIG. 4 shows the detailed arrangement of an original reading unit 202 of this embodiment.

Referring to FIG. 4, the original reading unit 202 comprises a CCD line sensor 21, an A/D conversion unit 22, a shading correction unit 23, a LOG conversion unit 24, a color conversion unit 25, a compression unit 26, a storage unit 27, and expansion units 281 to 284.

Referring to FIG. 4, R, G, and B luminance signals of an original image read by the CCD 21 in the original reading unit 202 are input to the A/D conversion unit 22, and are converted into R, G, and B digital luminance signals. These digital luminance signals are supplied to the shading correction unit 23, and are subjected to shading correction to eliminate sensitivity variations and light amount unevenness of the individual elements of the CCD 21. The R, G, and B luminance signals corrected by the shading correction unit 23 are LOG-converted into C, M, and Y signals by the LOG conversion unit 24.

The C, M, and Y image signals output from the LOG conversion unit 24 are converted into L*, a*, and b* luminance chromaticity signals by the color conversion unit 25, and the converted signals are compressed by the compression unit 26 in units of two-dimensional blocks having a predetermined size using a multi-valued image data encoding method such as vector quantization. The compressed data for one scan of the CCD 21 are stored in the storage unit 27.

Upon forming an image, the expansion units 281 to 284 read out the L*, a*, and b* compressed data stored in the storage unit 27, convert them into Y, M, C, and K recording color component signals, and supply the converted signals to-the printer control unit 201. At this time, in the printer of this embodiment, since the toner image transfer positions of the Y, M, C, and K photosensitive drums 1_a_ to 1_d_ are offset from each other, the expansion units 281 to 284 can parallelly supply image data at spatially different positions to the printer control unit 201.

The Y, M, C, and K signals expanded by the expansion units 281 to 284 are supplied to the γ correction units 291 to 294, and their characteristics are set using the corresponding γ-LUTs 44, as will be described later. Then, the image signals are converted, so that the original image densities match the output image densities processed according to the γ characteristics upon initializing the printer unit 100 (in the stabilization control mode).

The image signals input to the γ correction units 291 to 294 are converted into pulse-width modulated signals by the pulse width modulation unit 47, and the converted signals are input to the laser drivers 1021 to 1024, thus driving the semiconductor lasers 103 shown in FIG. 1.

In this embodiment, electrostatic latent images having gradation characteristics defined by changes in dot area are formed on the photosensitive drums 1_a_ to 1_d_ by scanning laser beams using a gradation reproduction means based on pulse-width conversion processing in which pixels of all the colors are arranged in the sub-scanning direction, and gradation images are obtained via the developing, transfer, and fixing processes.

Figure 5:
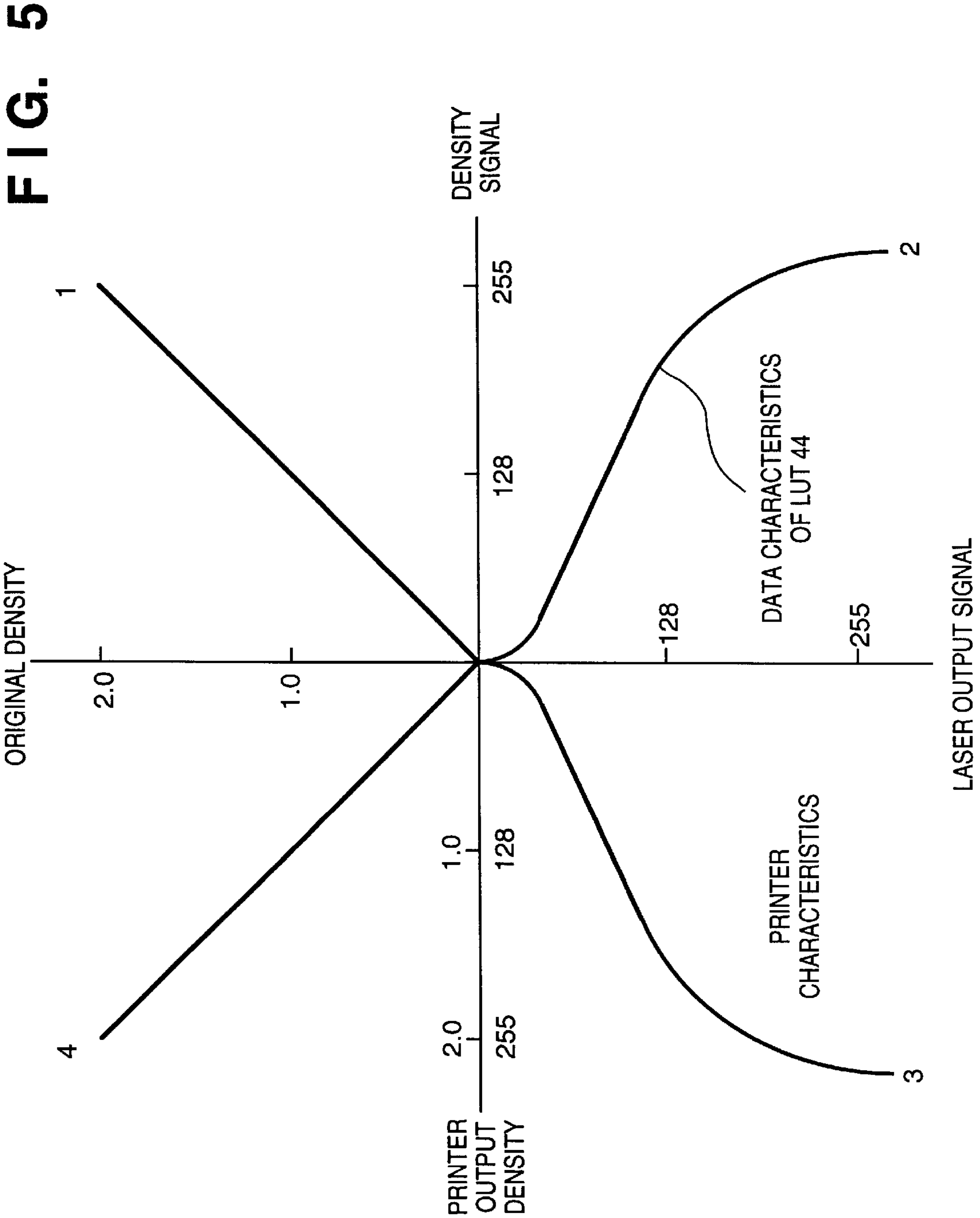
FIG. 5 is a four-quadrant chart showing the gradation reproducibility in the first embodiment.

FIG. 5 shows the characteristics for density reproduction of an original image.

Referring to FIG. 5, the first quadrant (the upper right region in FIG. 5) represents the characteristics of the original reading unit 202 for converting an original density into a density signal, and the second quadrant (the lower right region in FIG. 5) represents the characteristics of the γ-LUT 44 for converting the density signal into a laser output signal.

The third quadrant (the lower left region in FIG. 5) represents the characteristics of the printer unit 100 for converting the laser output signal into a printer output density, and the fourth quadrant (the upper left region in FIG. 5) represents the relationship between the original density and the printer output density. That is, the characteristics shown in the fourth quadrant represent as a whole the gradation characteristics of the printer unit 100 of this embodiment.

In this embodiment, the distortion of the printer characteristics shown in the third quadrant is corrected by the γ-LUT 44 having the characteristics shown in the second quadrant, so as to obtain linear gradation characteristics in the printer unit 100, as shown in the fourth quadrant in FIG. 5.

Note that the number of gradation levels that can be expressed is 256 since each image signal is processed as an 8-bit digital signal in this embodiment.

Figure 6:
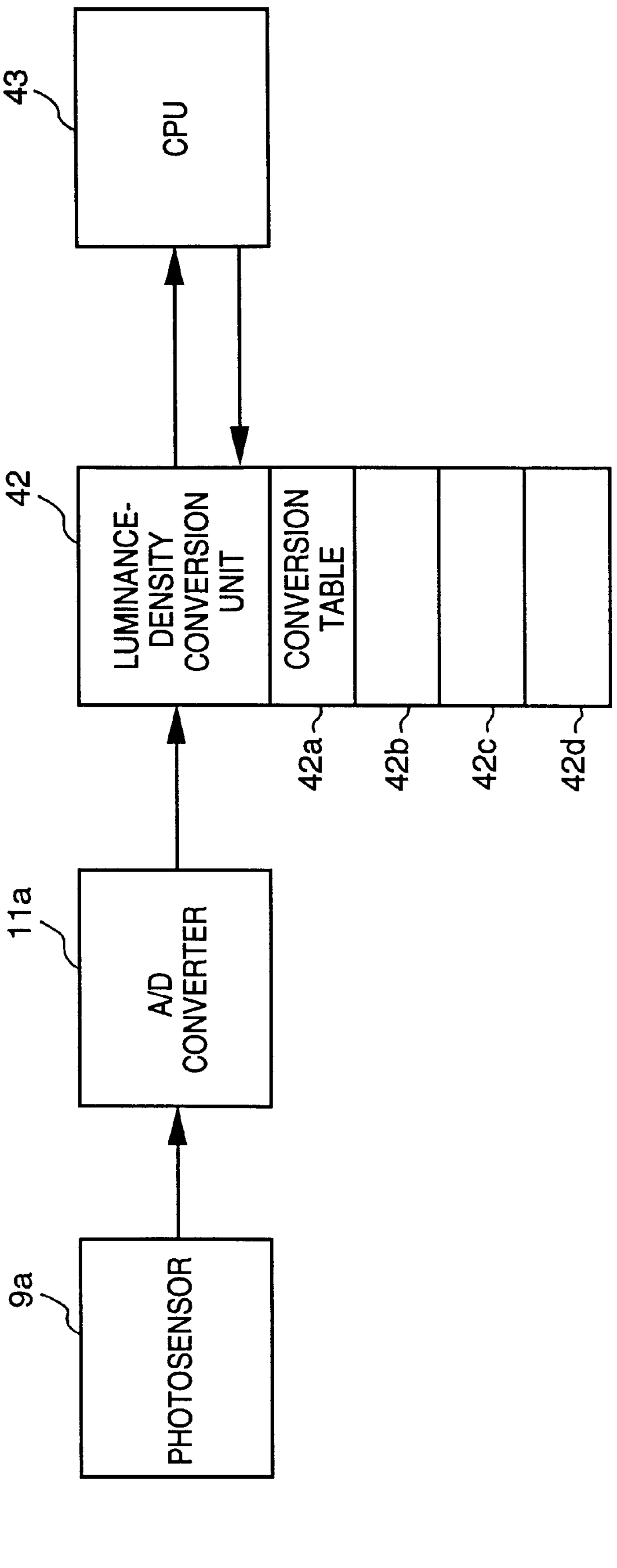
FIG. 6 is a diagram showing signal processing starting from a photosensor in correspondence with reflected light of yellow toner.

The manner in which the luminance signals of toner images detected by the photosensors 9*a* to 9*d* shown in FIGS. 2 and 3 are fetched by the CPU 43 as density signals will be described below with reference to FIG. 6. FIG. 6 is a diagram for explaining the state wherein a signal output from the photosensor 9*a* corresponding to light reflected by a yellow toner image is input to the CPU 43.

Referring to FIG. 6, reference numeral 42 denotes a luminance-density conversion unit, which has luminance-density conversion tables (to be simply referred to as conversion tables hereinafter) 42*a* to 42*d*. The conversion tables 42*a* to 42*d* comprise RAMs, and store tables, formed by the CPU 43, for respectively converting yellow, magenta, cyan, and black luminance signals into density signals in correspondence with the characteristics of the respective color components.

Near infrared light, i.e., light reflected by a yellow toner and incident on the photosensor 9*a* is converted by the photosensor 9*a* into an electrical signal, and the electrical signal, i.e., an output voltage of "0" to "5" V, is converted by the A/D converter 11*a* into a digital signal of one of "0" to "255", levels. The digital luminance signal is converted into a density signal using the conversion table 42*a* in the luminance-density conversion unit 42, and the density signal is input to the CPU 43. This density data will be referred to as "first density data (Dn1)" hereinafter.

The conversion tables 42*a* to 42*d* in the above-mentioned luminance-density conversion unit 42 will be described below.

Figure 7:
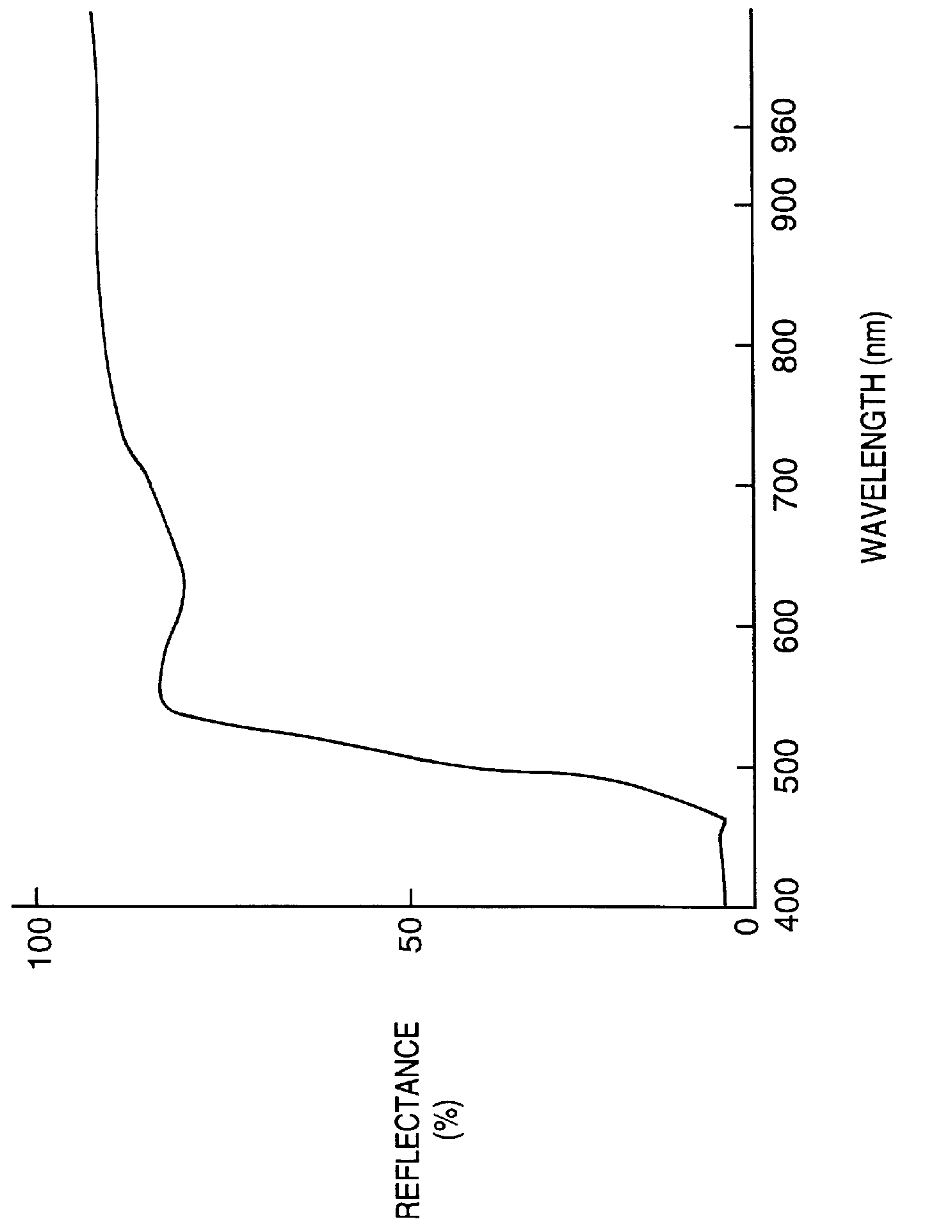
FIG. 7 is a graph showing an example of yellow toner spectral characteristics in the first embodiment.
Figure 8:
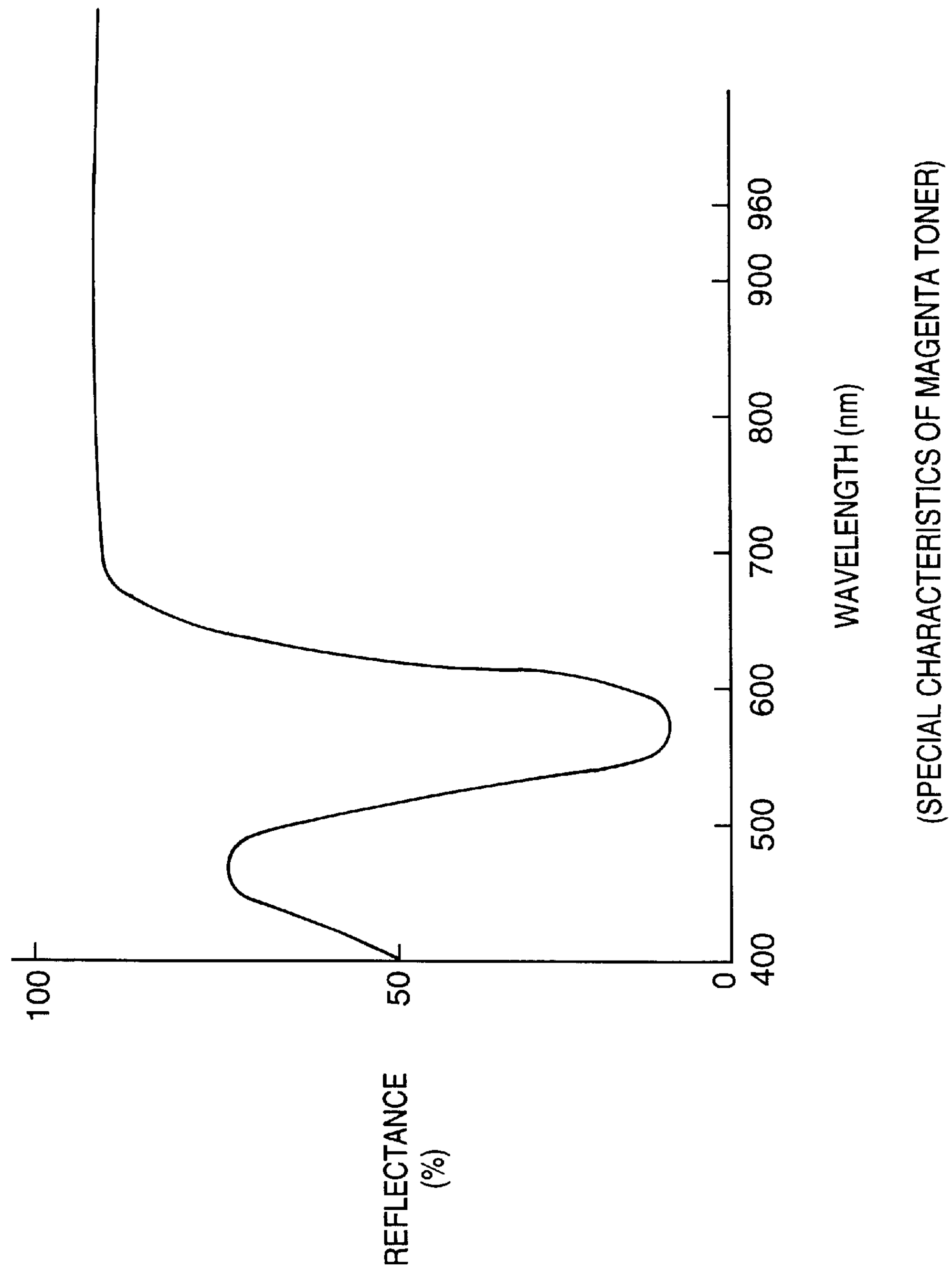
FIG. 8 is a graph showing an example of magenta toner spectral characteristics in the first embodiment.
Figure 9:
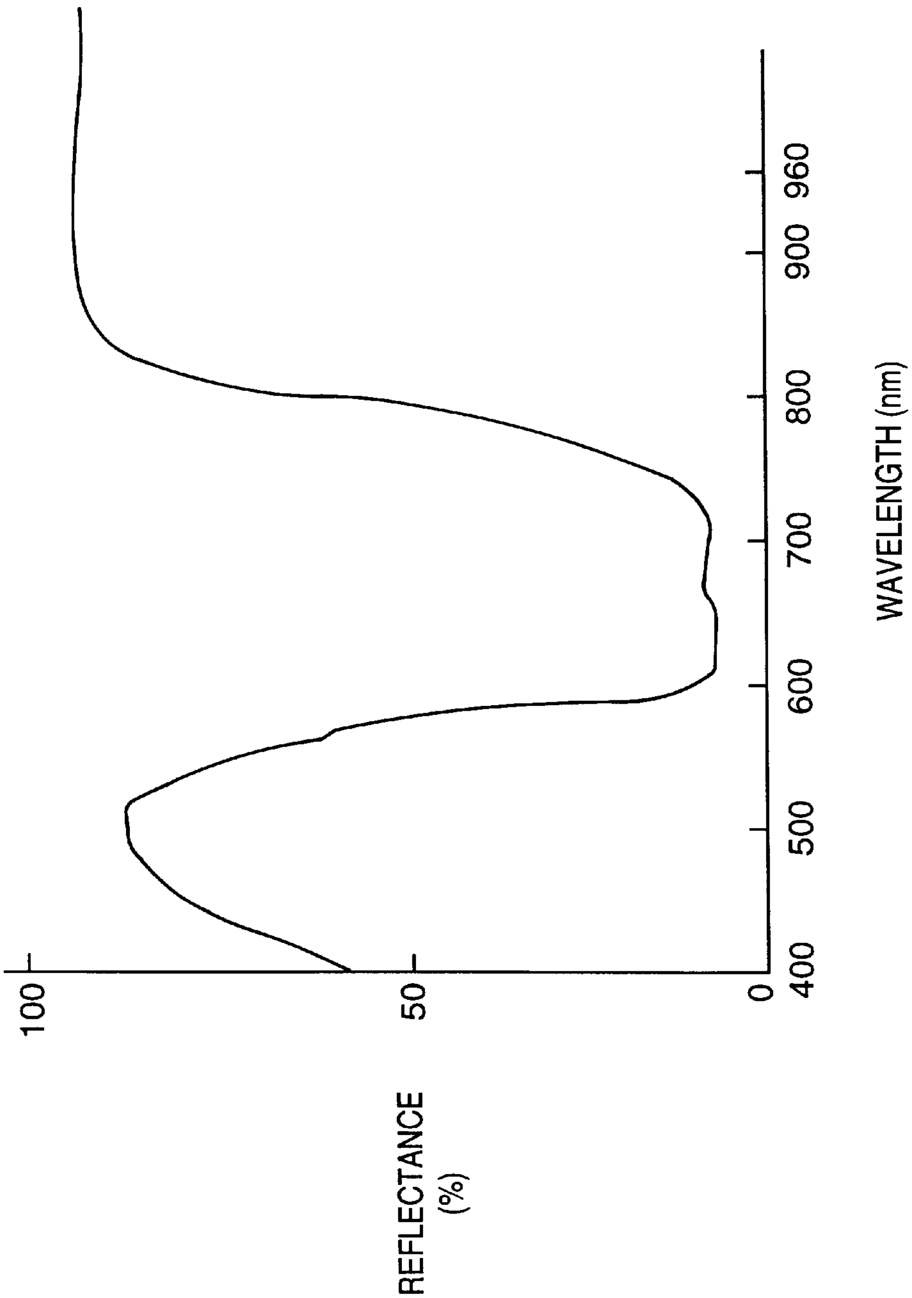
FIG. 9 is a graph showing an example of cyan toner spectral characteristics in the first embodiment.

FIGS. 7 to 9 show the spectral characteristics of yellow, magenta, and cyan toners. As shown in FIGS. 7 to 9, the respective toners have a near infrared light (960 nm) reflectance of 80% or higher. In this embodiment, upon forming these color toner images, a two-component developing method advantageous for color purity and transmittance is adopted. Note that yellow, magenta, and cyan color toners used in this embodiment are formed by dispersing the respective coloring agents using a styrene-based polymeric resin as a binder.

Figure 10:
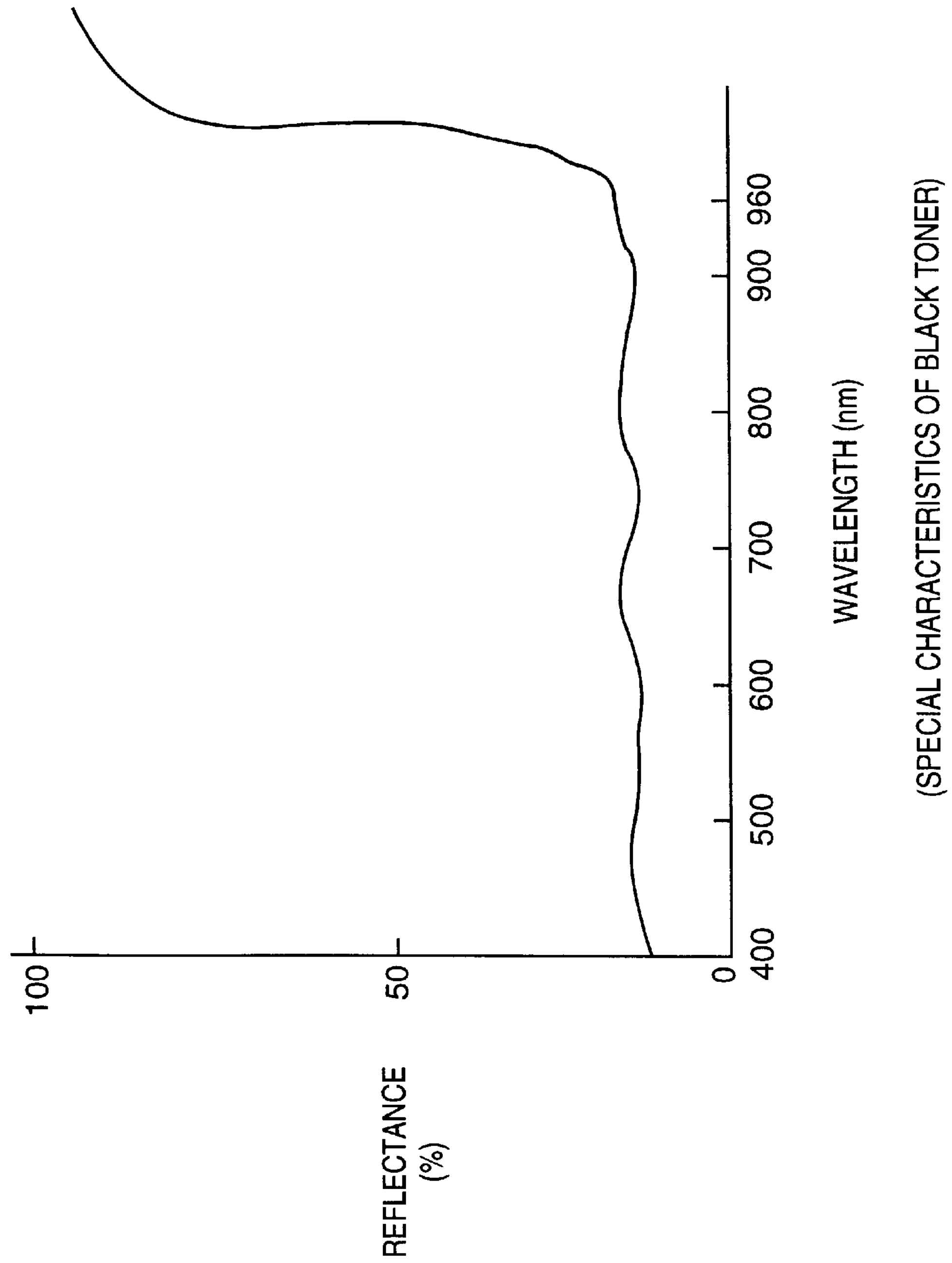
FIG. 10 is a graph showing an example of black toner (monocomponent magnetic toner) spectral characteristics in the first embodiment.

On the other hand, in this embodiment, black toner uses monocomponent magnetic toner, which can reduce running cost for monochrome copies. FIG. 10 shows the spectral characteristics of black toner. As shown in FIG. 10, the near infrared light (960 nm) reflectance of black toner is as low as about 10%. In this embodiment, black toner is developed by a monocomponent jumping development method. Alternatively, for example, a black two-component toner may be used.

The photosensitive drums 1*a* to 1*d* of this embodiment comprise OPC drums, and have a near infrared light (960 nm) reflectance of about 40%. Note that the photosensitive drums 1*a* to 1*d* may comprise, e.g., amorphous silicon-based drums, or the like.

Figure 11:
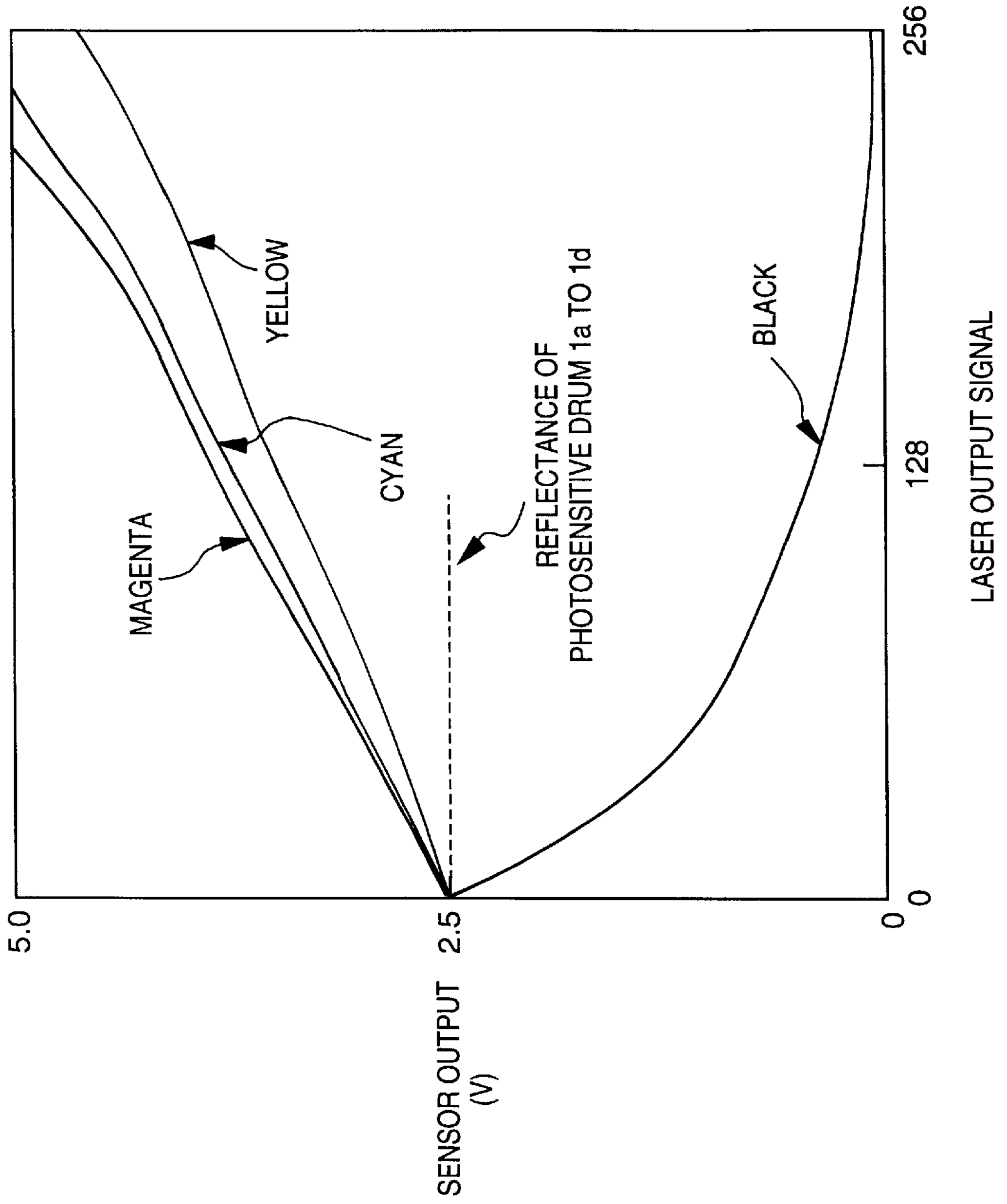
FIG. 11 is a graph showing the relationship between the laser output signal and the photosensor outputs in the first embodiment.

FIG. 11 shows the relationship between the laser output signal and the outputs from the photosensors 9*a* to 9*d* when the color toner image densities on the photosensitive drums 1*a* to 1*d* are stepwise changed by an area gradation method. In FIG. 11, the output from each of the photosensors 9*a* to 9*d* in a state wherein no toners adhere to the photosensitive drums 1*a* to 1*d* is set to be "2.5" V, i.e., level "128".

As can be seen from FIG. 11, as the laser output signal increases, the area covering ratios of yellow, magenta, and cyan color toners that cover the photosensitive drums 1*a* to 1*c* increase, and the outputs from the photosensors 9*a* to 9*c* increase accordingly as compared to the outputs corresponding to the photosensitive drums 1*a* to 1*c* themselves. On the other hand, as the area covering ratio of black toner that covers the photosensitive drum 1*d* increases, the output from the photosensor 9*d* decreases as compared to that output corresponding to the photosensitive drum 1*d* itself.

Figure 12:
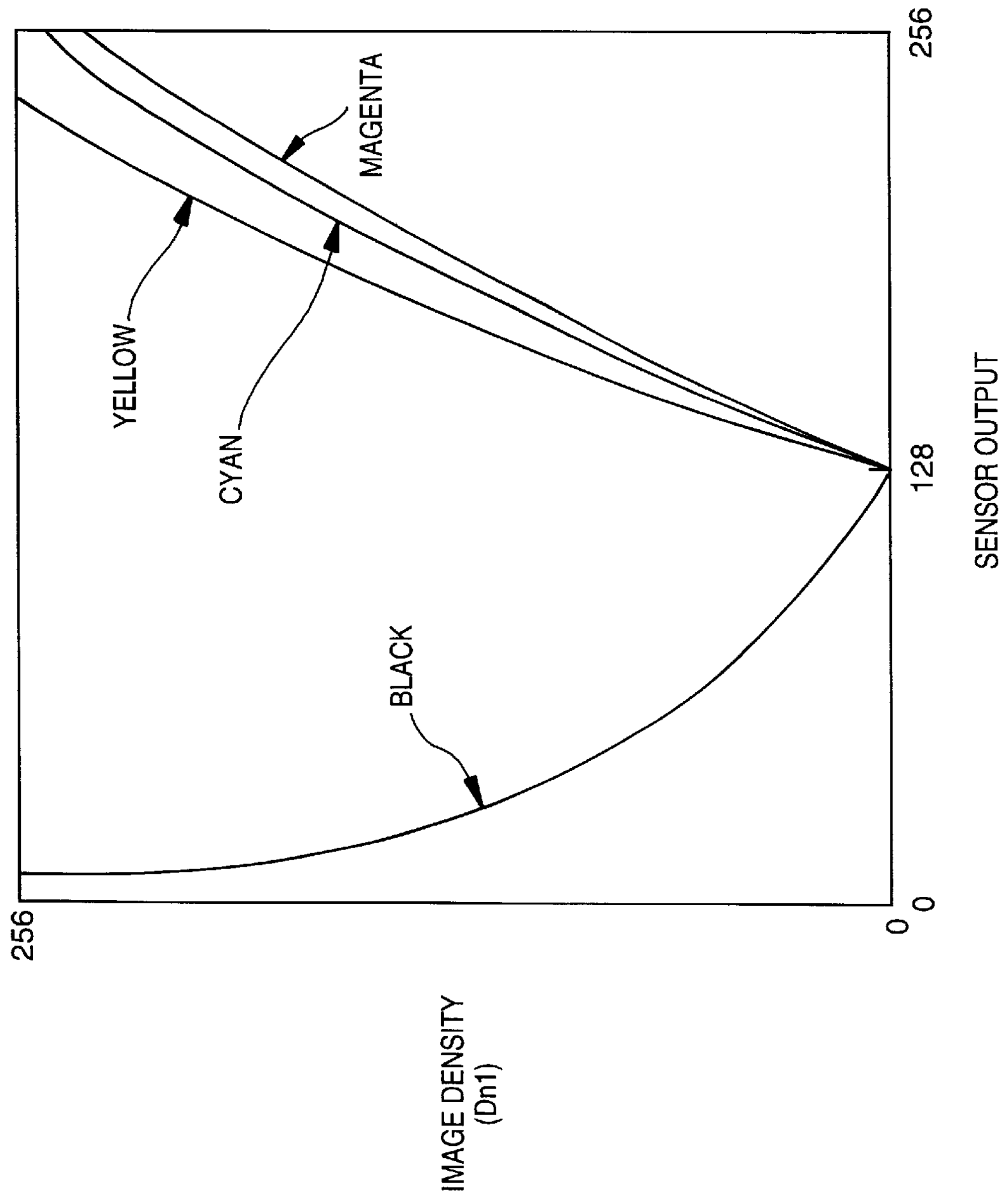
FIG. 12 is a graph showing the contents of a table for converting the photosensor outputs into density signals in the first embodiment.

Therefore, in consideration of the characteristics of the respective toners described above, the contents of the conversion tables 42*a* to 42*d* of the luminance-density conversion unit 42 are set in accordance with FIG. 12. In FIG. 12, the ordinate plots the first density data (Dn1), and the abscissa plots the outputs from the photosensors 9*a* to 9*d*. Also, the yellow, magenta, cyan, and black characteristics respectively correspond to the conversion tables 42*a*, 42*b*, 42*c*, and 42*d*. Using the conversion tables 42*a* to 42*d* shown in FIG. 12, the density signals of the respective colors can be read with high accuracy.

The gradation correction control in this embodiment, i.e., the setting process of each γ-LUT 44 by the CPU 43, will be described below with reference to the flow chart shown in FIG. 13. As described above, the control program used for executing the gradation correction control of this embodiment is stored in the ROM 210, and is executed by the CPU 43 using the RAM 212 as a work area.

Figure 13:
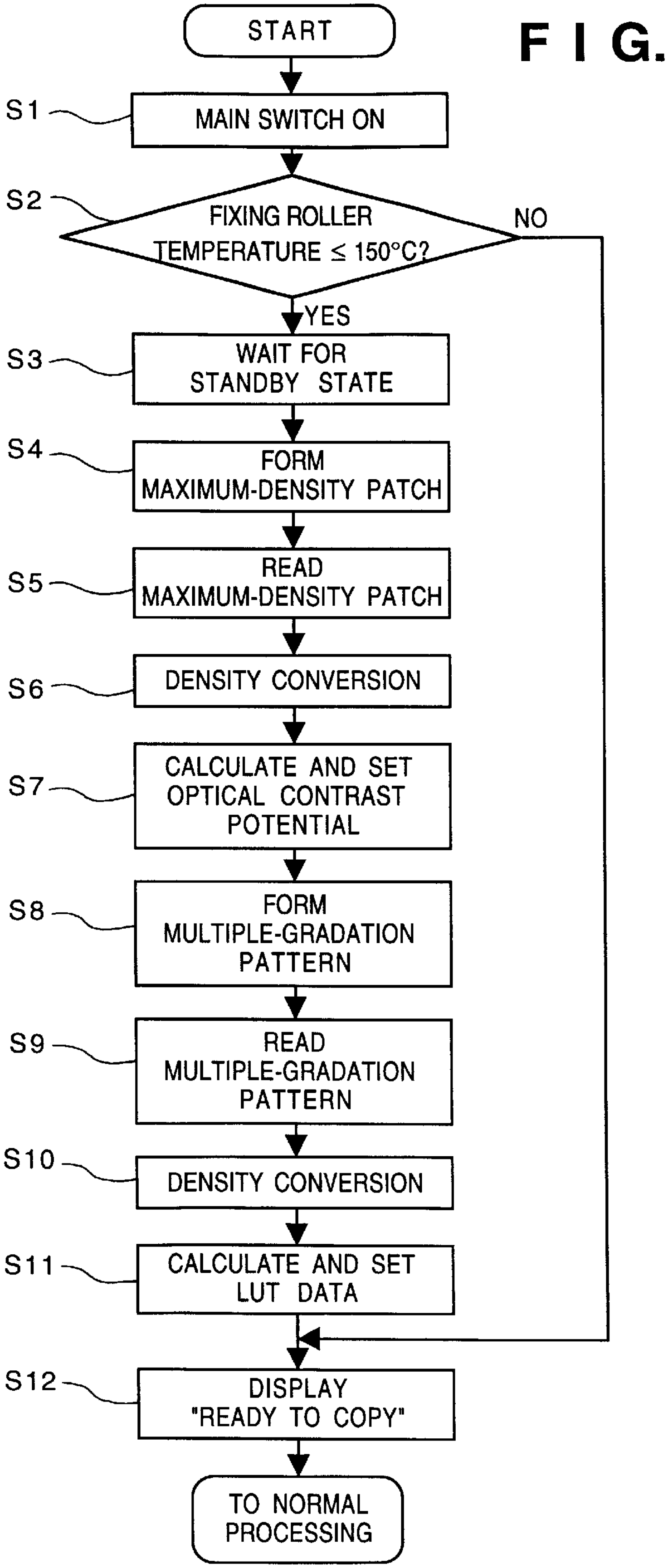
FIG. 13 is a flow chart showing the first gradation correction processing in the first embodiment.

Referring to FIG. 13, a main power switch is turned "ON" in step S1. It is checked in step S2 if the temperature of the pair of fixing rollers 51 and 52, i.e., the fixing temperature is equal to or lower than 150° C. If YES in step S2, the flow advances to step S3 since it is determined that the gradation correction control must be performed; otherwise, the flow jumps to step S12 without executing any gradation correction control since it is determined that the printer unit 100 was used immediately before this processing.

In step S3, the control waits until the temperature of the fixing rollers reaches a predetermined temperature, and the laser temperature of the semiconductor lasers 103 reaches a temperature control point, so that the lasers 103 are set in a standby state. At the same time, potential control as one mode of image stabilization control is performed. More specifically, the initial levels of the grid bias and developing bias are controlled to correct any changes in the discharge amount of a primary charger and the sensitivity deterioration of the photosensitive drums, on the basis of data obtained by measuring the potentials of the drum surfaces using potential sensors (not shown) respectively arranged in correspondence with the photosensitive drums 1*a* to 1*d*.

In addition, the photosensors 9*a* to 9*d* measure light reflected by the corresponding photosensitive drums to acquire data used for correcting contaminations (i.e., contaminations of so-called sensor windows) of the surfaces of the respective sensors.

The flow then advances to step S4, and a yellow patch pattern having a maximum density value corresponding to a laser output signal "255" is formed on the corresponding photosensitive drum 1*a*. Note that the pattern signal representing the patch pattern is generated by the pattern generator 45 shown in FIG. 3.

Figure 14:
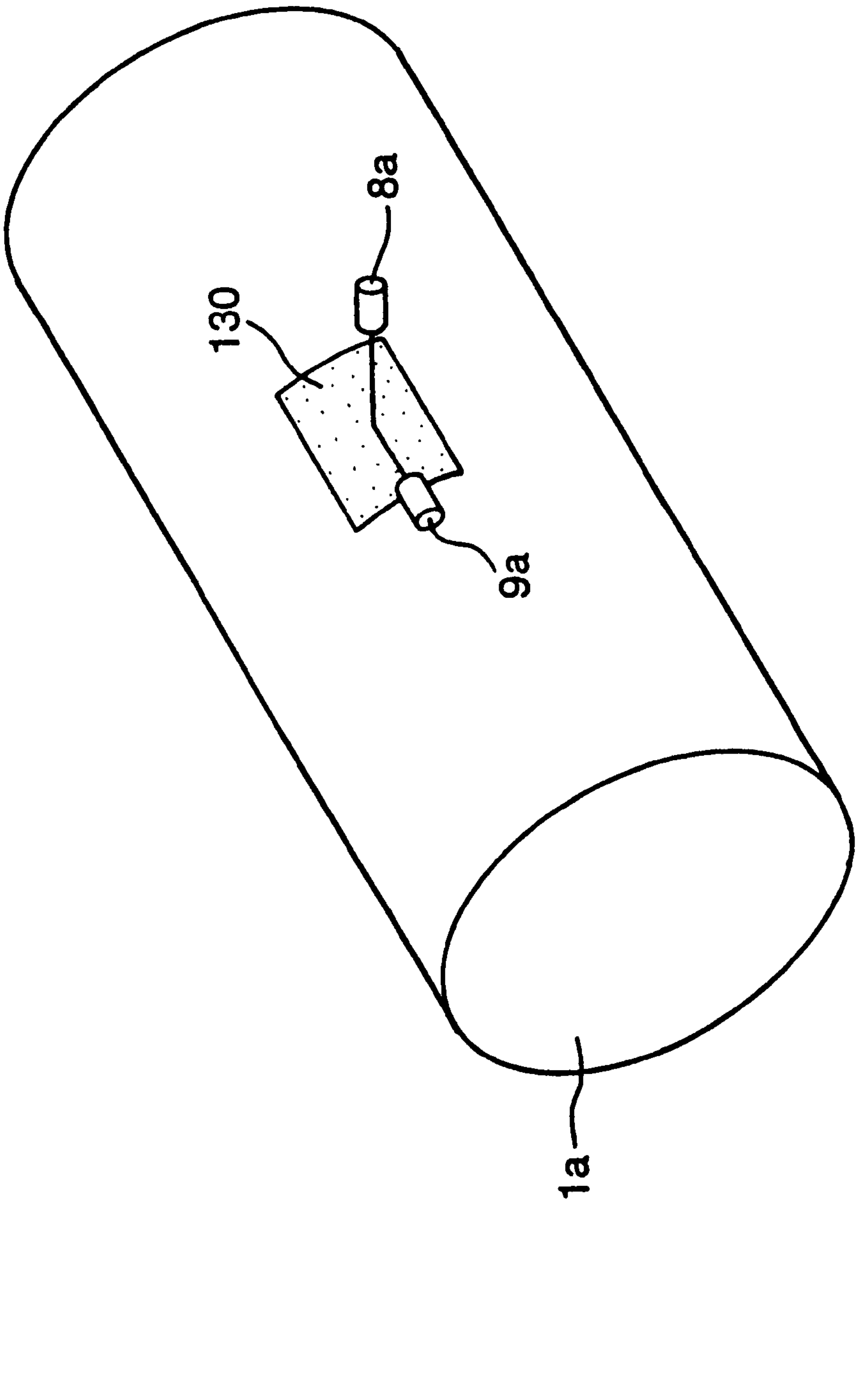
FIG. 14 is a perspective view showing maximum density patch data in the first embodiment.

FIG. 14 shows an example of the yellow patch pattern formed on the photosensitive drum 1*a*. Referring to FIG. 14, reference numeral 130 denotes a patch pattern having a maximum density and formed on the photosensitive drum 1*a*; 8*a*, an LED, and 9*a*, a yellow photosensor.

The flow advances to step S5. In step S5, the LED 8*a* illuminates the yellow patch pattern having the maximum density formed on the photosensitive drum 1*a* in step S4, and light reflected by the patch pattern is read by the photosensor 9*a*. In step S6, the read luminance signal is converted into a yellow density signal by the luminance-density conversion unit 42, as described above.

The flow advances to step S7 to check the difference between the density signal obtained in step S6 and a setting maximum density value of the printer unit 100, and the contrast potential is calculated based on the difference, thereby correcting the values of the grid bias and developing bias.

Subsequently, in step S8, the pattern generator 45 generates a pattern signal to form a yellow multiple-gradation patch pattern on the photosensitive drum 1*a*.

Figure 15B:
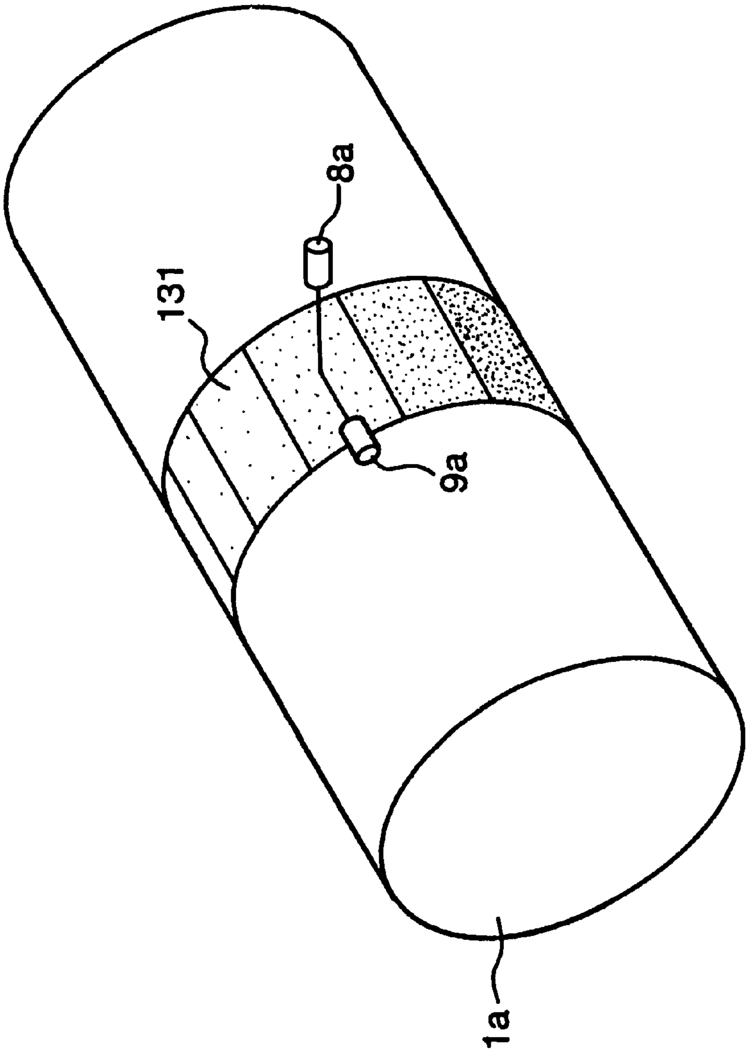
FIGS. 15A and 15B are views showing multiple-gradation patch data in the first embodiment.
Figure 15A:
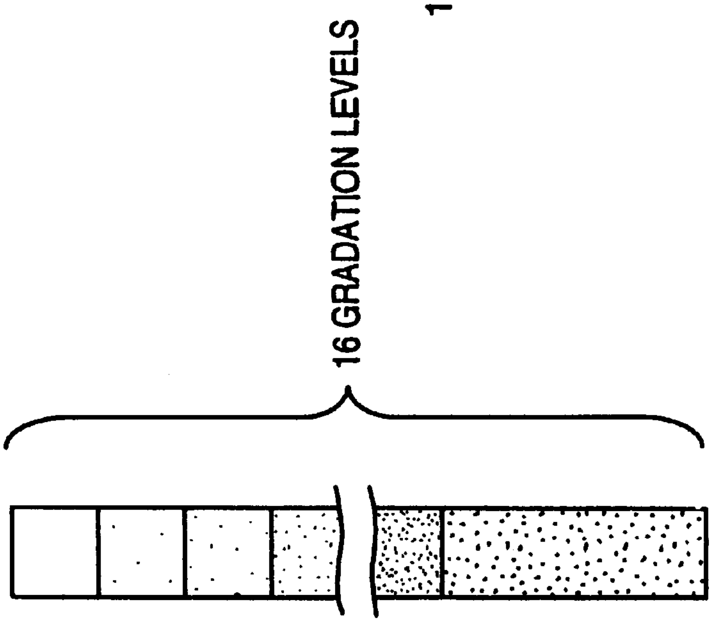

FIG. 15A shows an example of the yellow multiple-gradation patch pattern formed on the photosensitive drum 1*a*. In this embodiment, the multiple-gradation patch pattern has 16 gradation levels corresponding to 16 levels, i.e., "16", "32", "48", "64", "80", "96", "112", "128", "144", "160", "176", "192", "208", "224", "240", and "255". The patch pattern shown in FIG. 15A is continuously formed in the circumferential direction of the photosensitive drum 1*a*, as shown in FIG. 15B. Note that reference numeral 8*a* in FIG. 15B denotes an LED; and 9*a*, a yellow photosensor.

The flow advances to step S9. In step S9, the multiple-gradation patch pattern shown in FIG. 15A and 15B is illuminated by the LED 8*a*, and light beams reflected by the respective pattern portions are read by the photosensor 9*a*. In step S10, the read luminance signals are converted into yellow density signals by the luminance-density conversion unit 42, as described above.

With the above-mentioned processing, the relationship between the output signal from the semiconductor laser 103 and the first density data (Dn1), i.e., the printer characteristics shown in the third quadrant in FIG. 5 above, can be accurately obtained without actually transferring, fixing, and outputting any patch pattern on a recording medium.

In step S11, the γ-LUT 44 shown in FIG. 3 is calculated so as to correct the printer characteristics.

As described above, in this embodiment, any distortion in the recording characteristics of the printer unit shown in the third quadrant of FIG. 5 is corrected by the γ-LUT 44 having the characteristics shown in the second quadrant of FIG. 5, so as to obtain linear gradation characteristics of the printer unit 100, as shown in the fourth quadrant of FIG. 5.

Therefore, in step S11, by reversing the input/output relationship of the printer characteristics shown in the third quadrant of FIG. 5 obtained in step S10, the γ correction characteristics of the printer unit shown in the second quadrant can be determined in units of densities, and all the contents corresponding to 256 gradation levels of the γ-LUT 44 can be set. The above-mentioned characteristics of the γ-LUT 44 are calculated and set by the CPU 43.

When γ correction is performed using the γ-LUT 44 set by the CPU 43, as described above, optimal yellow density correction that takes the current printer characteristics into consideration can be realized.

The above-mentioned processing operations in steps S4 to S11 are performed for magenta, cyan, and black parallel to those for yellow, although not shown in FIG. 13.

That is, the patch forming operations, the patch reading operations, and the like with respect to the photosensitive drums 1*a* to 1*d* are simultaneously performed for the respective colors.

Based on the obtained color density data, the CPU 43 sequentially calculates γ-LUT data to set the γ-LUTs 44 in units of colors.

By performing such parallel operations for the respective colors, even in a printer of a type having a plurality of photosensitive drums, gradation characteristic stabilization control can be performed at high speed.

Upon completion of processing for all the colors, the flow advances to step S12, and a message "ready to copy" is displayed on the operation panel 300 to inform the operator of this state. Thereafter, the printer unit is set in a copy standby state. The processing sequence in the gradation characteristic stabilization control mode has been described.

In the subsequent steps, normal image forming processing is started. Upon forming an image, by setting the γ-LUTs 44 obtained by using the first density data (Dn1), as described above, linear gradation characteristics with respect to the original densities can be obtained in units of colors, and a high-quality image can be formed.

As described above, in this embodiment, since gradation correction control using the first density data Dn1 is performed, an image with good gradation characteristics can be formed over a long period of time.

<Second Embodiment>

The second embodiment of the present invention will be described below. The hardware arrangement of the second embodiment is the same as that in the first embodiment, and a detailed description thereof will be omitted.

Upon long term use of the printer unit 100, the densities obtained by reading patterns on the photosensitive drums 1*a* to 1*d* often deviate from those of an actual printout image. For example, when the cleaning blades are in sliding contact with the photosensitive drums 1*a* to 1*d* for a long period of time so as to remove the residual toners on the photosensitive drums 1*a* to 1*d* after the transfer process, the surfaces of the photosensitive drums 1*a* to 1*d* roughen, and hence, scattered light components increase. For this reason, the relationship between the outputs from the photosensors 9*a* to 9*d* and the formed image densities changes from an initial state.

Figure 16:
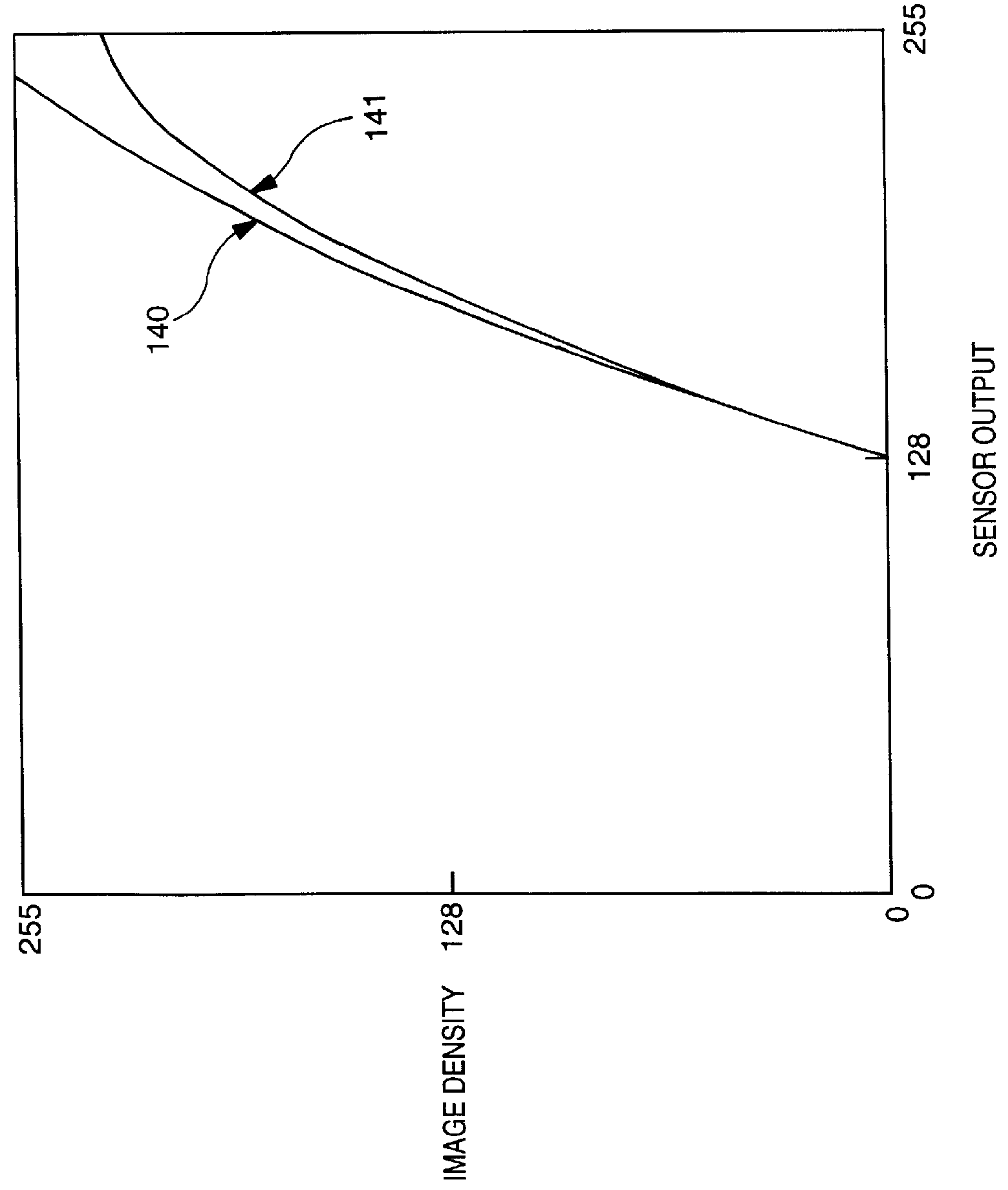
FIG. 16 is a graph showing a decrease in image density with respect to the photosensor outputs due to a long term use in the second embodiment according to the present invention.

FIG. 16 shows the relationship between the output from the photosensor 9*a* and the actually output image density when taking yellow as an example. A curve 140 in FIG. 16 represents an ideal relationship as in FIG. 12 above, but a curve 141 represents the relationship after image formation was performed on 10,000 sheets. More specifically, as the printer unit 100 is used, the output image density tends to lower.

When the relationship between the output from the photosensor 9*a* and the actually output image density becomes one represented by the curve 141 in FIG. 16, good gradation characteristics cannot be obtained by performing the gradation correction control described in the first embodiment above.

Therefore, the second embodiment has as its object to prevent the output image density from lowering due to long term use of the printer unit 100 by executing the second gradation correction control in addition to the first gradation correction control in the first embodiment described above.

In the second embodiment, the second gradation correction control is performed after the above-mentioned first gradation correction control has ended. The second gradation correction control is characterized by performing luminance-density conversion table updating processing immediately before or after step S3 in the flow chart shown in FIG. 13.

The luminance-density conversion table updating processing in the second embodiment, i.e., the setting processing of the luminance-density conversion tables 42*a* to 42*d* by the CPU 43, will be explained below with reference to the flow chart in FIG. 17.

More specifically, in the second embodiment, by re-setting the characteristics of the conversion tables 42$a$ to 42$d$ shown in FIG. 6 to be good ones, the color balance upon reading patch patterns at a later time can be adjusted.

The control will be explained in detail below.

Figure 17:
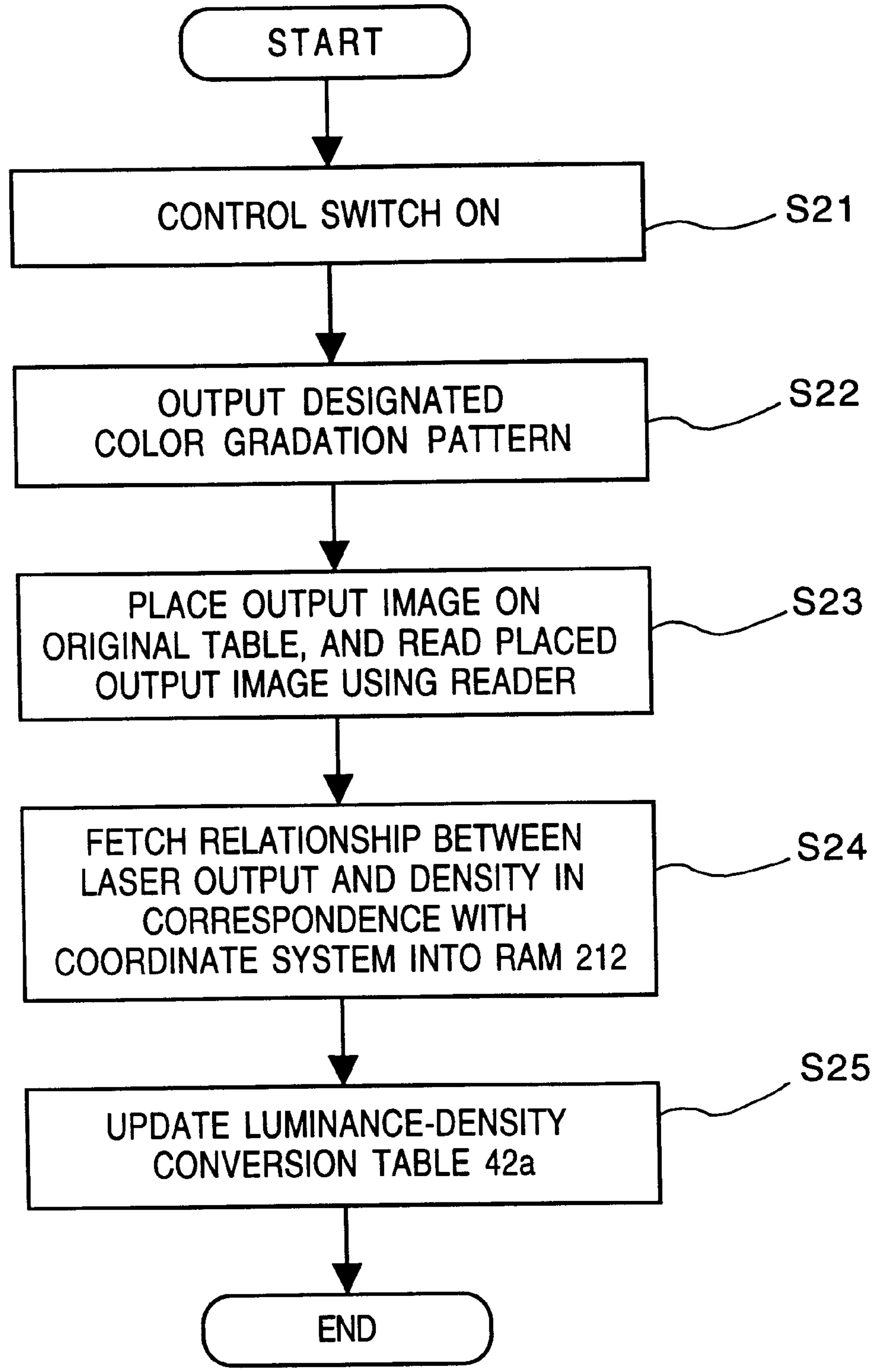
FIG. 17 is a flow chart showing the second gradation correction processing in the second embodiment.

In step S21 in FIG. 17, the operator designates a color whose conversion characteristics are to be corrected (e.g. a color determined to have abnormal gradation characteristics) using the operation panel 300 shown in FIG. 1, and turns "ON" a start switch of a conversion table updating mode. A case will be exemplified below where in yellow is selected in step S21.

Figure 18:
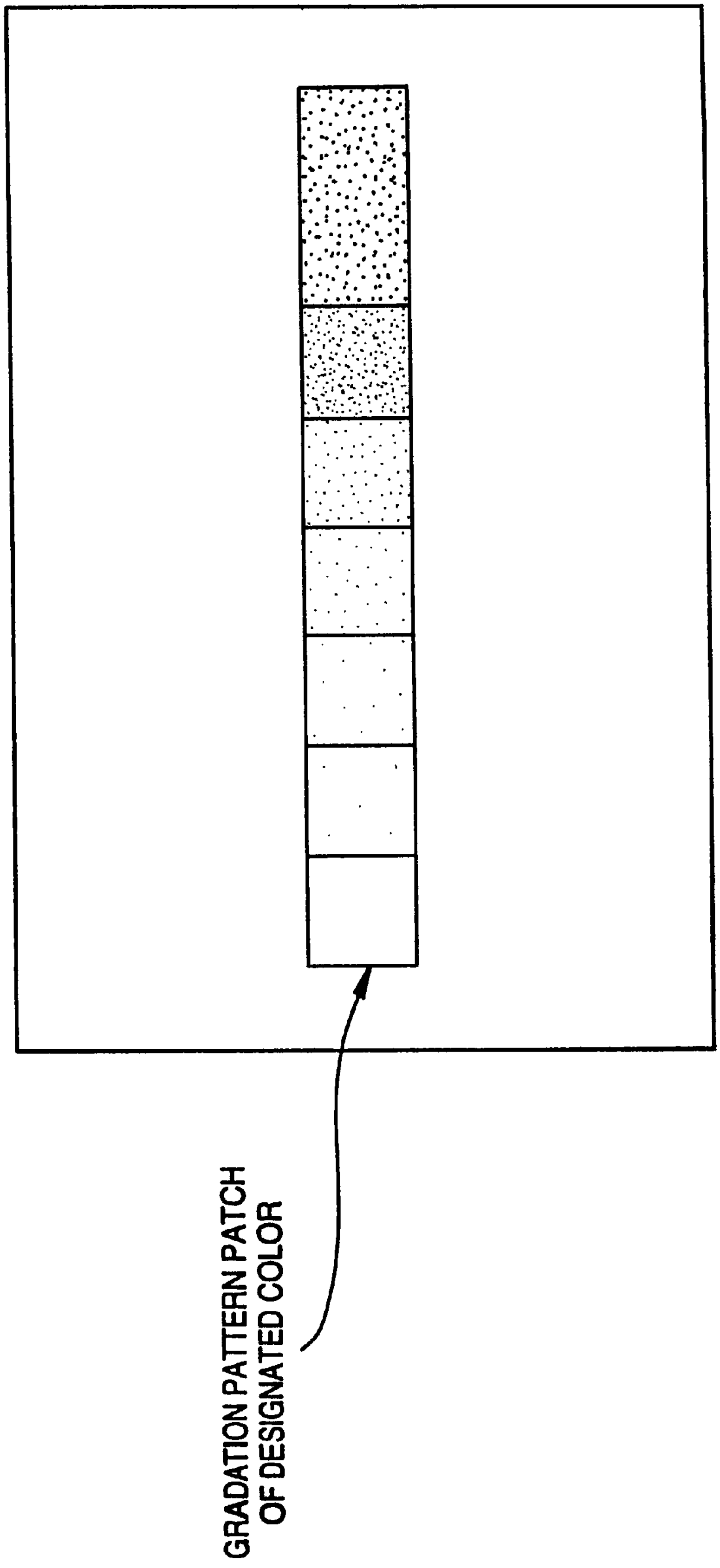
FIG. 18 is a view showing an output example of patch data in the second embodiment.

The flow then advances to step S22. In step S22, the pattern generator 45 shown in FIG. 3 forms a multiple-gradation patch pattern of the color designated in step S21 on the photosensitive drum 1$a$, and the patch pattern is transferred and output onto a recording medium. FIG. 18 shows an example of the patch pattern output onto the recording medium in step S22.

In step S23, the gradation patch pattern shown in FIG. 18 output in step S22 is read by the original reading unit 202, and is converted into a luminance signal by the CCD 21. The luminance signal is LOG-converted by the LOG conversion unit 24 shown in FIG. 4, and the CPU 43 fetches the converted data as C, M, and Y density data. These density data will be referred to as "second density data (Dn2)" hereinafter.

As is generally known, an optical system using the CCD can exhibit good measurement reproducibility by performing shading correction. Therefore, the read second density data Dn2 has high accuracy. In step S24, the relationships between the laser output levels and the second density data (Dn2) as the density values of the respective read gradation patch pattern portions in units of gradation levels of the patch pattern, i.e., the contents of the conversion table 42$a$ of the luminance-density conversion unit 42 shown in FIG. 6, are obtained in correspondence with the coordinate system, and are stored in the RAM 212.

In step S25, the conversion table 42$a$ is updated based on the contents stored in the RAM 212.

The updating processing of the conversion table 42$a$ will be described in detail below.

In the first density data (Dn1) described in the first embodiment and the second density data (Dn2), since the data Dn2 indicates the currently effective density value, the data Dn2 and Dn1 come to have a difference therebetween. If k represents this difference, the difference k is expressed as follows as a ratio in units of 16 gradation levels:

$$k=Dn1/Dn2$$

When this ratio k is reflected in the conversion table 42$a$ for converting the output signal from the photosensor 9$a$ into a density signal, the output signal from the photosensor 9$a$ is corrected more absolutely with respect to the effective density value. Since the data Dn1 has already been stored in the RAM 212, the ratio k can be obtained in step S24 above.

Figure 19:
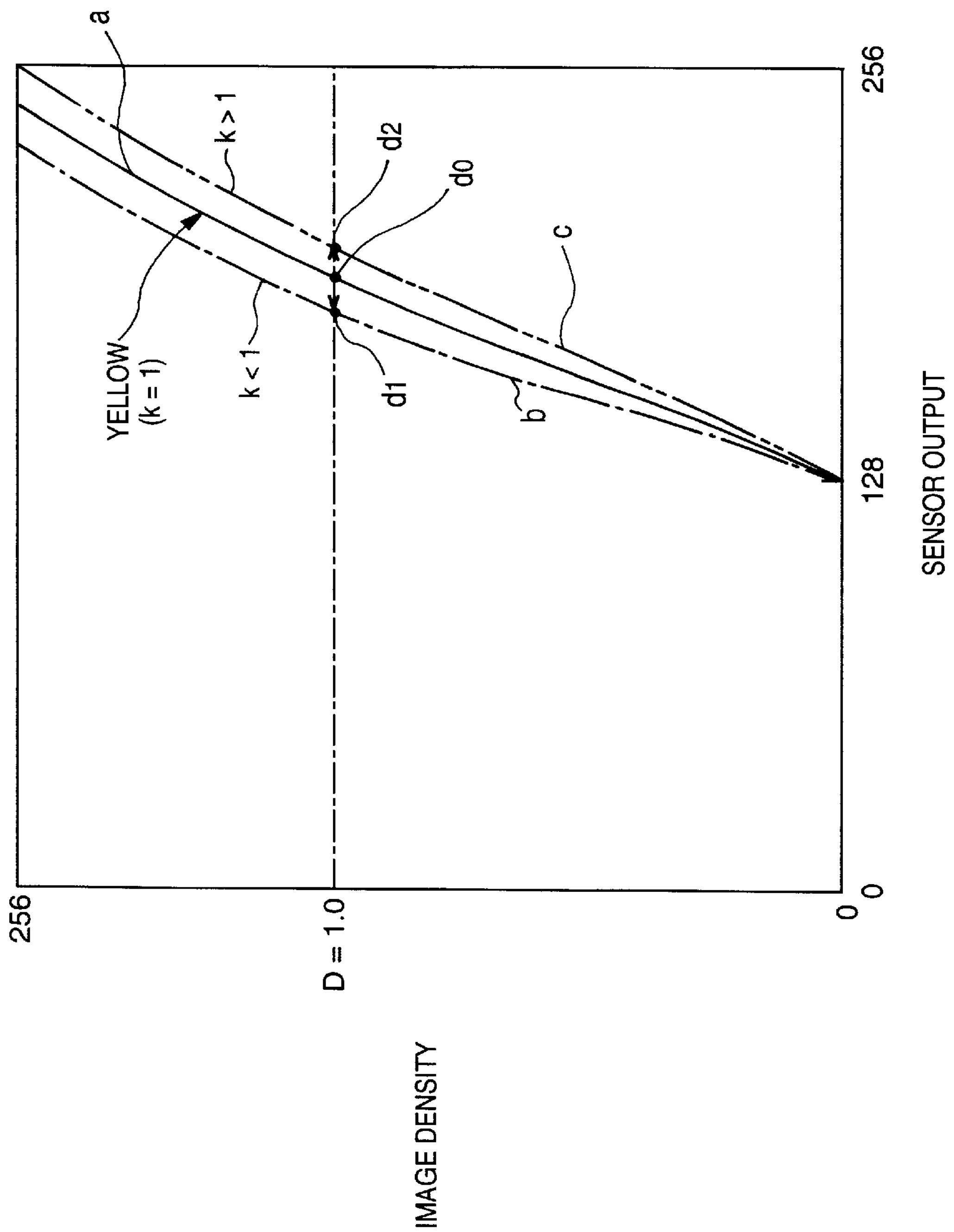
FIG. 19 is a graph showing an example of an updated conversion table in the second embodiment.

The updating processing of the conversion table 42$a$ will be described in more detail below with reference to FIG. 19. FIG. 19 shows curves of only the table 42$a$ corresponding to yellow, which is extracted from the conversion tables 42$a$ to 42$d$ shown in FIG. 12 above. A solid curve a in FIG. 19 represents the conversion table 42$a$ when k=1, and the output signal value of the photosensor 9$a$ is shifted so that an alternate long and short dashed curve b is obtained when k<1, and an alternate long and two short dashed curve c is obtained when k>1. If d0, d1, and d2 represent points to be converted into an image density D=1.0 on the curves a, b, and c, the conversion table 42$a$ is updated to shift the point d0 to the point d1 when k<1 or to shift the point d0 to d2 when k>1.

More specifically, since the output from the photosensor 9$a$ corresponding to yellow corresponds to the image density within the range from "128" to "255" in FIG. 19, if x represents the output from the photosensor 9$a$ corresponding to the solid curve representing k=1, processing given by the following equation can be performed:

$$x'=(x-128)\times k+128$$

With this processing, the solid curve of k=1 representing the conversion table 42$a$ shifts to the left, as indicated by the alternate long and short dashed curve, when k<1, or shifts to the right, as indicated by the alternate long and two short dashed curve, when k>1. Thus, even when the value read by the photosensor 9$a$ deviates, the converted density value can be appropriately corrected. Note that the above-mentioned updating processing of the conversion table 42$a$ is automatically performed based on the above equation by the CPU 43 in the printer unit 100.

In the above-mentioned example, correction at one point corresponding to the image density D=1.0 has been exemplified. However, the densities of all the 16 gradation-level patch pattern portions shown in FIG. 15A may be corrected and interpolated to obtain other data, and the interpolated data may be subjected to smoothing processing as needed. Therefore, the conversion table 42$a$ can have data for 256 gradation levels. Of course, higher-order interpolation or higher-order approximation is more preferable to improve accuracy.

Processing similar to the above-mentioned updating processing of the conversion table 42$a$ is repetitively performed for the tables corresponding to required colors.

By performing the processing operations in step S4 and the subsequent steps in FIG. 13 using the conversion tables 42$a$ to 42$d$ updated by the second gradation correction control, the printer characteristics shown in the third quadrant in FIG. 5 are obtained. By reversing the input/output relationship of the printer characteristics, the γ correction characteristics of the printer unit shown in the second quadrant in FIG. 5 are determined in units of densities, and contents corresponding to all the 256 gradation levels of the γ-LUT 44 are set. More specifically, using the first density data (Dn1) obtained by re-measuring the patch pattern on the drum, the γ-LUT 44 is generated again. In this manner, the second gradation correction control is completed.

In the above-mentioned example, processing for yellow has been described. When this processing is performed for all the colors, i.e., for all the photosensors 9$a$ to 9$d$ corresponding to the respective colors, a good color balance can be maintained.

As described above, when image formation is performed using the γ-LUTs 44 set via not only the first gradation correction control but also the second gradation correction control, the density correction can be performed in consideration of the current printer characteristics irrespective of any change in reading characteristics of the measuring units 3$a$ to 3$d$.

Note that the processing described in the second embodiment need only be performed upon adjustment in assembling of the apparatus or upon exchange of the photosensors 9$a$ to 9$d$. However, as described above, when the apparatus is used over a long period of time, since changes in characteristics over time of photosensors 9$a$ to 9$d$ differ from each other, the above-mentioned processing is preferably performed at appropriate time intervals.

As described above, according to the second embodiment, since the second gradation correction control using the first and second density data Dn1 and Dn2 is performed in addition to the first gradation correction control of the first embodiment described above, an image which has good gradation characteristics over a long period of time, and also has not only a good color balance but also good reproduction densities can be formed.

<Third Embodiment>

The third embodiment of the present invention will be described below. The hardware arrangement of the third embodiment is the same as that in the first embodiment, and a detailed description thereof will be omitted.

The second embodiment has explained an example wherein a decrease in formed image density generated after a long term use of the printer unit 100 is corrected by performing correction control (second gradation correction control) for a single color designated by the operator.

However, a decrease in formed image density due to a long term use can take place for all the color toners. Therefore, in the third embodiment, the second gradation correction control, which is performed for only the designated color in the second embodiment, is performed for all the colors, i.e., yellow, magenta, cyan, and black at the same time.

The second gradation correction control in the third embodiment, i.e., the setting process of the luminance-density conversion tables 42*a* to 42*d* by the CPU 43, will be described below with reference to the flow chart in FIG. 20.

Figure 20:
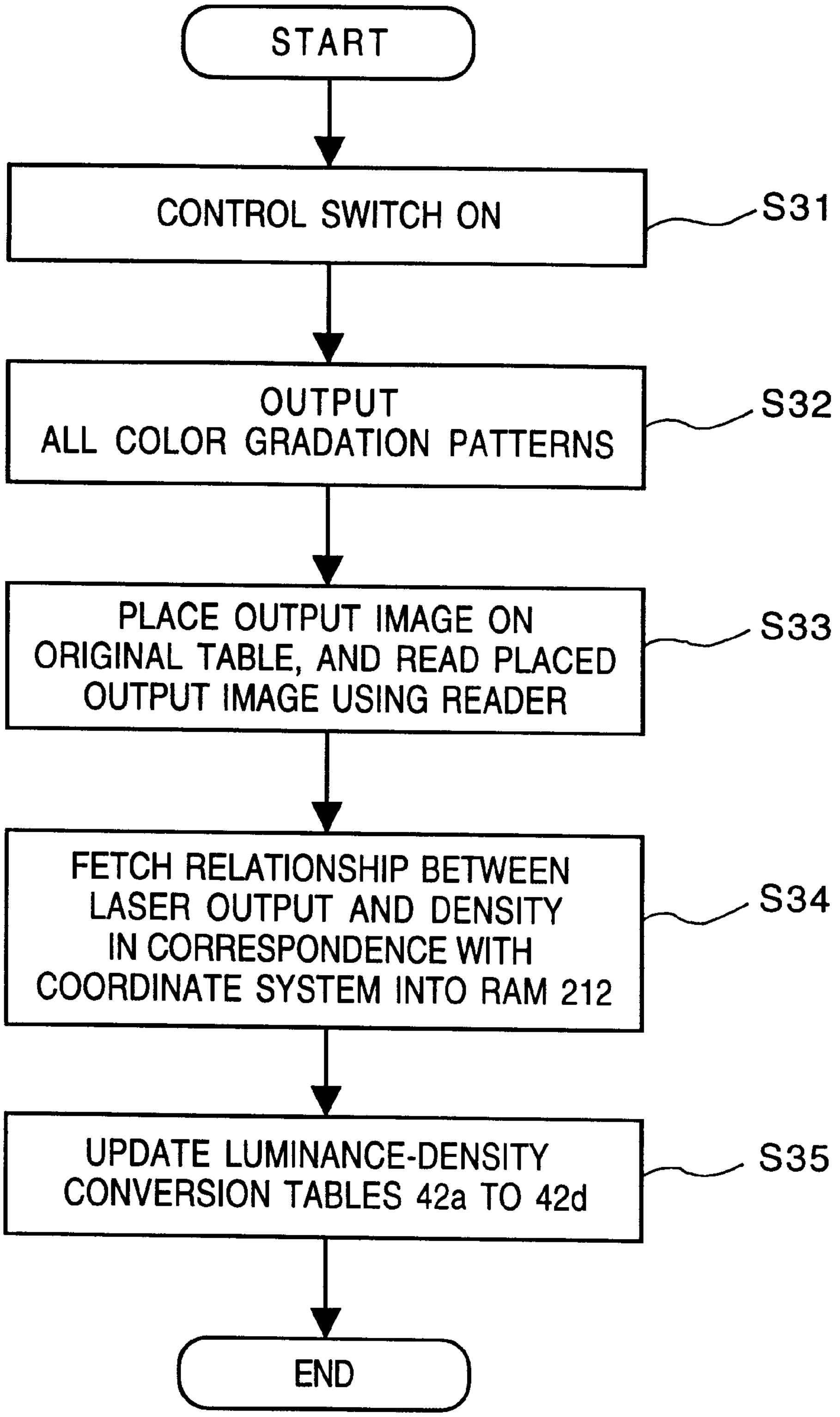
FIG. 20 is a flow chart showing the gradation correction processing in the third embodiment according to the present invention.

Referring to FIG. 20, the operator turns "ON" a start switch of the updating mode of the conversion tables using the operation panel 300 shown in FIG. 1, in step S31.

Figure 21:
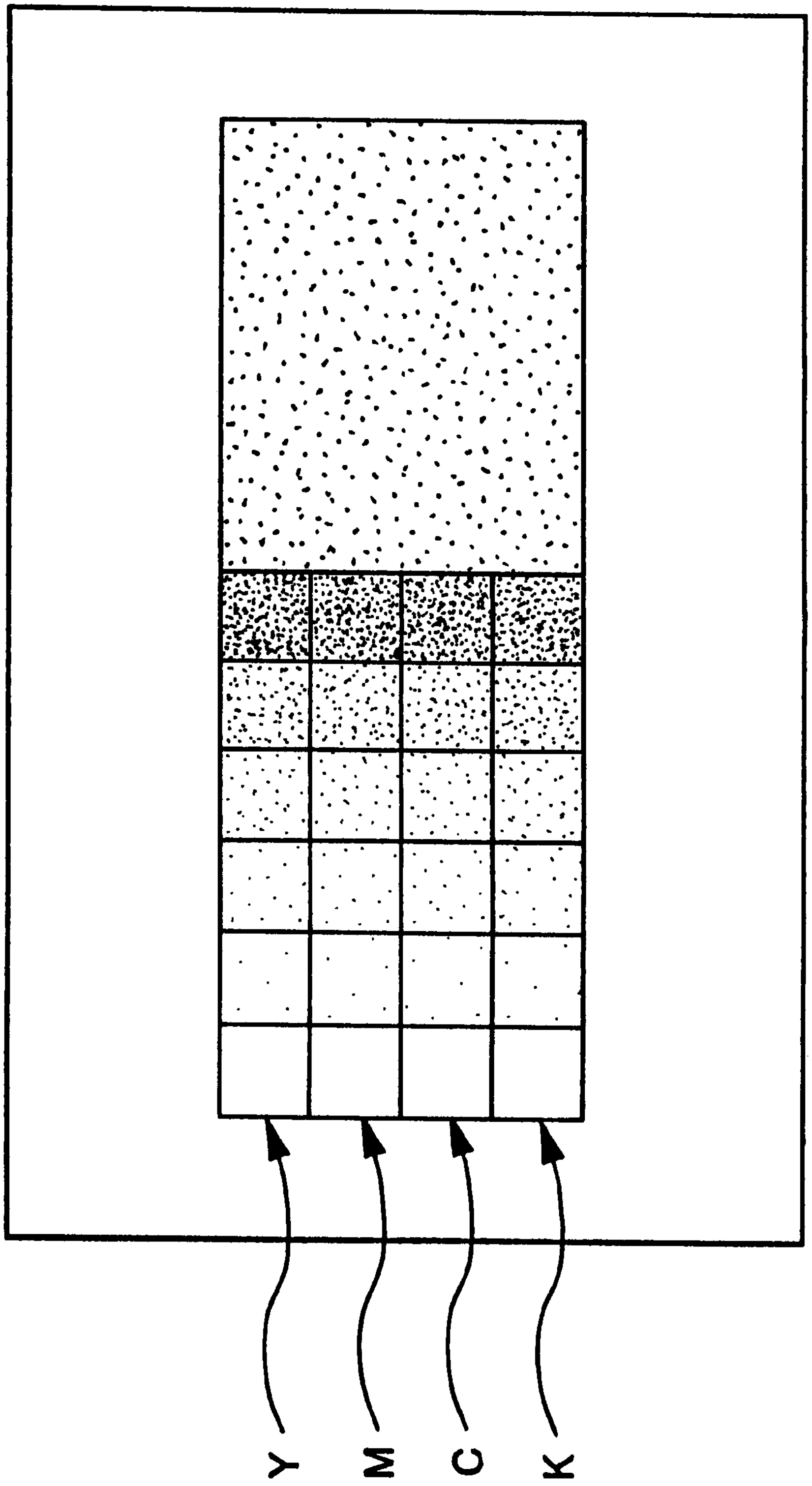
FIG. 21 is a view showing an output example of patch data in the third embodiment.

Subsequently, the flow advances to step S32. In step S32, the pattern generators 45 shown in FIG. 3 form multiple-gradation patch patterns for all the colors used on the corresponding photosensitive drums 1*a* to 1*d*, and the patterns are transferred and output onto a single recording medium. FIG. 21 shows an example of the patch patterns output onto the recording medium in step S32.

In step S33, the gradation patch patterns shown in FIG. 21 output in step S32 is read by the original reading unit 202, and the read patterns are converted into luminance signals by the CCD 21. The luminance signals are LOG-converted by the LOG conversion unit 24 shown in FIG. 4, and the converted data are fetched by the CPU 43 as Y, M, and C density data. These density data will be referred to as "second density data (Dn2)" hereinafter.

When the processing operations in step S34 and the subsequent steps are performed for all the colors as those in step S24 and the subsequent steps of the second embodiment shown in FIG. 17, the luminance-density conversion tables 42*a* to 42*d* are appropriately updated, and the density correction can be attained in consideration of the current reading characteristics of the photosensors 9*a* to 9*d* and the current printer characteristics.

Thereafter, when the processing operations in step S4 and the subsequent steps shown in FIG. 13 are performed again, the second gradation correction control in the third embodiment is executed.

As described above, according to the third embodiment, when the second gradation correction control using the second density data Dn2 is performed for all the colors at the same time, the gradation characteristics for all the colors can be maintained by single processing. Furthermore, when this processing is performed periodically, an image which has good gradation characteristics over a long period of time, and also has not only a good color balance but also good reproduction densities can be formed.

<Fourth Embodiment>

In the first embodiment described above, the γ correction characteristics are set by forming a patch pattern on the photosensitive drum and reading the formed patch pattern. Alternatively, in the fourth embodiment, a patch pattern is formed on a recording sheet, and the formed pattern is read by the CCD sensor 21, thereby setting the γ correction characteristics in consideration of the image forming condition on the recording sheet and the original reading characteristics of the CCD sensor 21. This processing will be referred to as a test print mode hereinafter.

Figure 22:
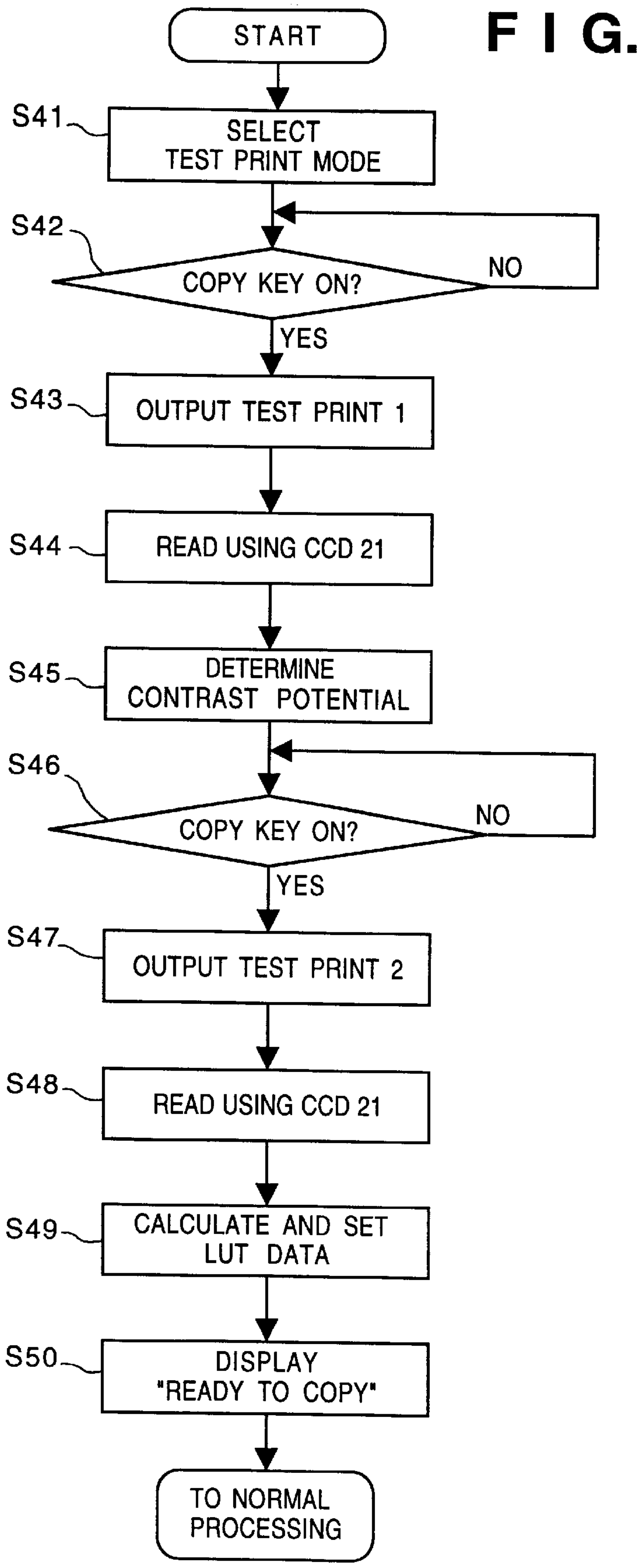
FIG. 22 is a flow chart showing the gradation correction processing in the fourth embodiment according to the present invention.

The processing of the fourth embodiment will be described in detail below with reference to the flow chart of FIG. 22.

Since the arrangement of the fourth embodiment is substantially the same as that shown in FIGS. 3 and 4 of the first embodiment, a detailed description of common portions will be omitted.

Figure 23B:
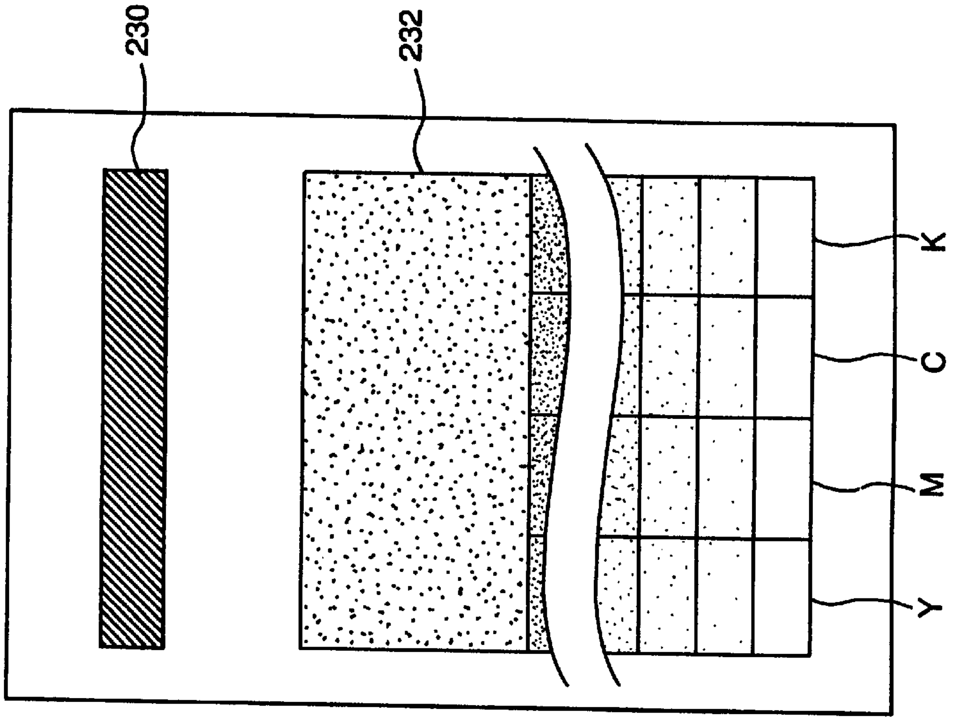
FIGS. 23A and 23B are views showing output examples of patch data in the fourth embodiment.
Figure 23A:
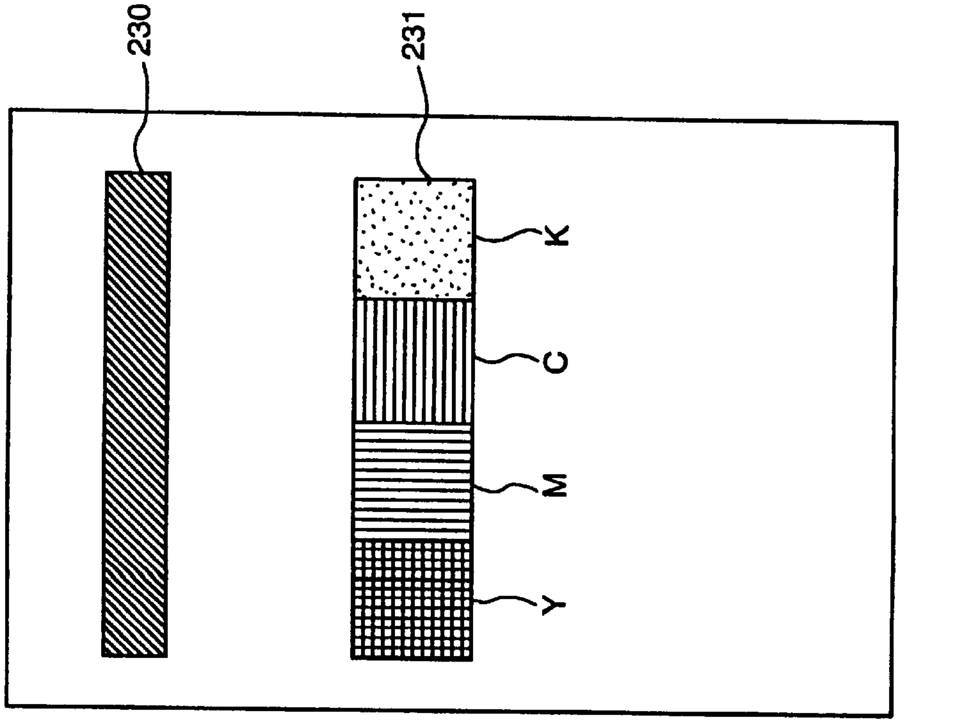

The operator selects the test print mode on the operation panel 300 (step S41), and then depresses a copy key (step S42). If it is determined in step S42 that the copy key is depressed, test print 1 is output (step S43). Test print 1 is obtained by forming Y, M, C, and K maximum-density patches on a recording sheet, as shown in FIG. 23A. Referring to FIG. 23A, reference numeral 230 denotes a reference position mark; and 231, maximum-density patches in units of colors. Test print 1 is placed on the original table of the original reading unit 202, and the respective color patches are read by the CCD 21 (step S44). Y, M, C, and K data obtained by sequentially processing the read signals and output from the expansion units 281 to 284 are supplied to the CPU 43, and the CPU 43 calculates the contrast potentials used in the potential control shown in FIG. 13 of the first embodiment in correspondence with the respective color image forming units (step S45).

If it is determined that the copy key is depressed (step S46), test print 2 is output (step S47). Test print 2 is obtained by forming Y, M, C, and K 16-gradation patch patterns (reference numeral 232) on a recording sheet, as shown in FIG. 23B. Test print 2 is formed under the image forming condition calculated in step S45. Test print 2 is read as in step S44 (step S48), and Y, M, C, and K color patch read data obtained from the expansion units 281 to 284 are supplied to the CPU 43. Then, the CPU 43 calculates data of the γ-LUTs 44 and sets the calculated data in the γ-LUTs 44 (step S49). Upon completion of the above-mentioned processing, a message "read to copy" is displayed (step S50), and a normal copy mode is restored.

Test prints 1 and 2 of the fourth embodiment are also formed based on pattern data generated by the pattern generators 45 shown in FIG. 3. In this case, in the gradation characteristic stabilization mode of the first embodiment, the pattern generators 45 for the respective colors are simultaneously operated in response to the ITOP signal, so that the respective color patch patterns for an identical density are parallelly formed. However, in the fourth embodiment, since images are actually formed on a recording sheet, the pattern generators 45 are operated in the order of Y, M, C, and K with respect to the ITOP signal in consideration of the distances between adjacent ones of the photosensitive drums 1*a* to 1*d*.

As described above, according to the fourth embodiment, the γ correction characteristics can be set in consideration of the image formation characteristics on the recording sheet, the original reading characteristics of the CCD 21, and the compression characteristics of the compression unit 26. At this time, since the patch patterns formed by the Y, M, C, and K color image forming units are read by the CCD 21 as a common reading means, a good color balance can be obtained.

Also, since the respective color patch patterns are formed on a common recording sheet, high-speed LUT setting processing can be realized.

Note that the test print mode of the fourth embodiment may be assigned as an additional function of the control of the first embodiment described above.

<Another Embodiment>

Note that the present invention may be applied to either a system constituted by a plurality of equipments (e.g., a host computer, an interface device, a reader, a printer, and the like), or an apparatus consisting of a single equipment (e.g., a copying machine, a facsimile apparatus, or the like).

The objects of the present invention are also achieved by supplying a storage medium, which records a program code of a software program that can realize the functions of the above-mentioned embodiments to the system or apparatus, and reading out and executing the program code stored in the storage medium by a computer (or a CPU, MPU, or the like) of the system or apparatus.

In this case, the program code itself read out from the storage medium realizes the functions of the above-mentioned embodiments, and the storage medium which stores the program code constitutes the present invention.

As the storage medium for supplying the program code, for example, a floppy disk, hard disk, optical disk, magneto-optical disk, CD-ROM, CD-R, magnetic tape, nonvolatile memory card, ROM, and the like may be used.

The functions of the above-mentioned embodiment may be realized not only by executing the readout program code by the computer but also by some or all of actual processing operations executed by an OS (operating system) running on the computer on the basis of an instruction of the program code.

Furthermore, the functions of the above-mentioned embodiments may be realized by some or all of actual processing operations executed by a CPU or the like arranged in a function extension board or a function extension unit, which is inserted in or connected to the computer and receives the program code read out from the storage medium.

Figure 24:
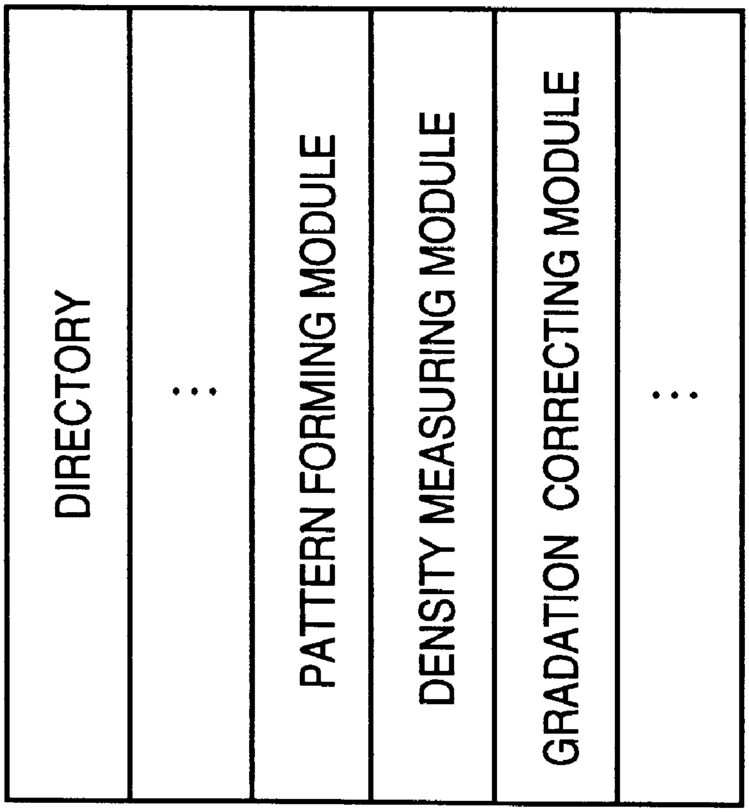
FIG. 24 is a view showing an example of a memory map upon application of the present invention to a storage medium.

When the present invention is applied to the storage medium, the storage medium stores program codes corresponding to the above-mentioned flow chart. In this case, modules shown in the memory map in FIG. 24 are stored in the storage medium. That is, at least a "pattern forming module", a "density measuring module", and a "gradation correcting module" can be stored in the storage medium.

In the above embodiments, a laser printer has been exemplified. However, the present invention may be applied to an LED printer, an ink-jet printer, or the like, which has a plurality of image forming units for respectively forming a plurality of color images.

The present invention is not limited to the above-mentioned embodiments, and various changes and modifications may be made within the scope of the appended claims.

What is claimed is:

1. An image processing apparatus having a reader for reading an original image and a plurality of image forming units for performing image formation using predetermined colors, comprising:

pattern data output means for outputting pattern data to each of the image forming units to cause the image forming units to form pattern images;

pattern image density measuring means, including a plurality of measuring units, each unit corresponding to a different color, for measuring densities of the pattern images formed by the respective image forming units to obtain pattern image density data;

gradation correcting means for performing gradation correction of image data to be output to each of the image forming units;

control means for controlling correction characteristics of said gradation correcting means in accordance with the pattern image density data reading characteristic correction means for correcting reading characteristics of each of said measuring units in accordance with pattern image data read by using said reader of pattern images formed on a recording medium and the pattern image density data obtained by said pattern image density measuring means.

2. The apparatus according to claim 1, wherein said control means corrects gamma characteristics of said gradation correcting means in accordance with the pattern image density data.

3. The apparatus according to claim 2, wherein said control means corrects gamma correction tables in accordance with the pattern image density data.

4. The apparatus according to claim 1, wherein said pattern output means outputs the pattern data as patterns having a plurality of gradation levels.

5. The apparatus according to claim 1, wherein each of said pattern image density measuring means comprises:

said measuring units for measuring an amount of light reflected by the pattern image formed on an image carrier; and conversion means for converting the measuring results of said measuring units into the pattern image density data, wherein said reading characteristic correcting means corrects conversion condition used by said conversion means.

6. The apparatus according to claim 1, wherein said control means controls contrast potentials in the image forming units on the basis of the pattern image density data.

7. The apparatus according to claim 6, wherein said pattern data output means outputs the pattern data as a maximum density pattern.

8. The apparatus according to claim 1, wherein the image forming units are arranged in correspondence with four colors, i.e., yellow, magenta, cyan, and black.

9. An image processing method in an image processing apparatus having a reader for reading an original image and a plurality of image forming units for performing image formation using predetermined colors, comprising:

a pattern forming steps of parallely forming pattern images by outputting pattern data to each of the image forming units;

a pattern image density measuring steps of obtaining pattern image density data by measuring densities of the pattern images formed by the respective image forming units by using a plurality of measuring units, each unit corresponding to a different color;

a pattern image correction control step, of controlling gradation correction characteristics, of image data to be output to each of the image forming units, in accordance with the pattern image density data; and a reading characteristics correcting step, of correcting reading characteristics of each of the measuring units in accordance with pattern image data read by using the reader of pattern images formed on a recording medium and the pattern image density data obtained in said pattern image density measuring step.

10. The method according to claim 9, wherein the pattern image correction control step includes a step of correcting gamma characteristics, in accordance with the pattern image density data.

11. The method according to claim 10, wherein the pattern image correction control step includes a step of correcting gamma correction tables in accordance with the pattern image density data.

12. The method according to claim 9, wherein the pattern forming step includes the step of outputting the pattern data as patterns having a plurality of gradation levels.

13. The method according to claim 9, wherein the pattern image density measuring step further comprises:

a light measuring step, of measuring an amount of light reflected by the pattern image formed on an image carrier by using said measuring units; and a conversion step, of converting the measuring results of the light measuring step into the pattern image density data, wherein said reading characteristic correcting step includes a step of correcting conversion condition used in said conversion step.

14. The method according to claim 9, further comprising a potential control step of controlling contrast potentials in the image forming units on the basis of the pattern image density data.

15. The method according to claim 14, wherein the pattern forming step includes the step of outputting the specific pattern data as a maximum density pattern.

16. A computer readable memory which stores a program code of image processing in an image processing apparatus having a reader for reading an original image and a plurality of image forming units for performing image formation using predetermined colors, comprising:

a code of a pattern forming steps of parallel forming pattern images by outputting pattern data to each of the image forming units;

a code of an image pattern density measuring steps of obtaining image pattern density data by measuring densities of the pattern images formed by the respective image forming units by using a plurality of measuring units, each unit corresponding to a different color;

a code of a pattern image correction control step of controlling gradation correction characteristics, of image data to be output to each of the image forming units, in accordance with the pattern image density data: and a code of a reading characteristics correcting step, of correcting reading characteristics of each of the measuring units in accordance with Pattern image data read by using the reader of pattern images formed on a recording medium and the pattern image density data obtained in said pattern image density measuring step.

* * * * *

UNITED STATES PATENT AND TRADEMARK OFFICE

CERTIFICATE OF CORRECTION

PATENT NO. : 6,148,158 Page 1 of 1
DATED : November 14, 2000
INVENTOR(S) : Koji Amemiya It is certified that error appears in the above-identified patent and that said Letters Patent is hereby corrected as shown below:

Title page,
Item [56], FOREIGN PATENT DOCUMENTS,
"63095471" should read -- 63-095471 --;
"053333652" should read -- 05-333652 --;
"06043729" should read -- 06-043729 --; and
"07056424" should read -- 07-056424 --.

Column 2,
Line 23, "rough" should read -- rough, --.

Column 8,
Line 21, "to-the" should read -- to the --.

Column 9,
Line 29, "" 255"," should read -- "255" --.

Column 18,
Line 14, "data" should read -- data; and --;
Line 55, "steps" should read -- step, --; and
Line 58, "steps" should read -- step, --.

Column 20,
Lines 9 and 12, "steps" should read -- step, --;
Line 18, "step" should read -- step, --; and
Line 25, "Pattern" should read -- pattern --.

Signed and Sealed this

Twenty-ninth Day of July, 2003

JAMES E. ROGAN
*Director of the United States Patent and Trademark Office*